United States Patent
Zhao et al.

[11] Patent Number: 5,964,947
[45] Date of Patent: Oct. 12, 1999

[54] REMOVABLE PUMPING CHANNEL LINERS WITHIN A CHEMICAL VAPOR DEPOSITION CHAMBER

[75] Inventors: Jun Zhao, Cupertino; Ashok Sinha, Palo Alto; Avi Tepman, Cupertino; Mei Chang, Saratoga; Lee Luo, Fremont; Alex Schreiber, Santa Clara; Talex Sajoto, Campbell; Stefan Wolff, Sunnyvale; Charles Dornfest, Fremont; Michal Danek, Cupertino, all of Calif.

[73] Assignee: Applied Materials, Inc., Santa Clara, Calif.

[21] Appl. No.: 08/857,847

[22] Filed: May 16, 1997

Related U.S. Application Data

[62] Division of application No. 08/680,724, Jul. 12, 1996, Pat. No. 5,846,332.

[51] Int. Cl.[6] ........................................ C23C 16/00
[52] U.S. Cl. ........................ 118/715; 118/725; 118/723 E
[58] Field of Search ........................ 118/715, 725, 118/723 E

[56] References Cited

U.S. PATENT DOCUMENTS

| | | | |
|---|---|---|---|
| 5,246,881 | 9/1993 | Sandhu et al. | 437/192 |
| 5,352,294 | 10/1994 | White et al. | 118/725 |
| 5,366,585 | 11/1994 | Robertson et al. | 156/643 |
| 5,372,648 | 12/1994 | Yamamoto et al. | 118/723 E |
| 5,425,812 | 6/1995 | Tsutahara et al. | 118/725 |
| 5,516,367 | 5/1996 | Lei et al. | 118/725 |
| 5,558,717 | 9/1996 | Zhao et al. | 118/715 |
| 5,582,866 | 12/1996 | White | 427/248.1 |
| 5,837,057 | 11/1998 | Koyama et al. | 118/723 VE |
| 5,882,411 | 3/1999 | Zhao et al. | 118/715 |
| 5,885,356 | 3/1999 | Zhao et al. | 118/723 ER |

FOREIGN PATENT DOCUMENTS 0 714 998 A2  6/1996  European Pat. Off. ........ C23C 16/44

*Primary Examiner*—Benjamin Utech
*Assistant Examiner*—Jeffrie R. Lund
*Attorney, Agent, or Firm*—Charles S. Guenzer

[57] ABSTRACT

A substrate processing chamber, particularly a chemical vapor deposition (CVD) chamber used both for thermal deposition of a conductive material and a subsequently performed plasma process. The invention reduces thermal deposition of the conductive material in a pumping channel exhausting the chamber. The pumping channel is lined with various elements, some of which are electrically floating and which are designed so that conductive material deposited on these elements do not deleteriously affect a plasma generated for processing the wafer.

20 Claims, 15 Drawing Sheets

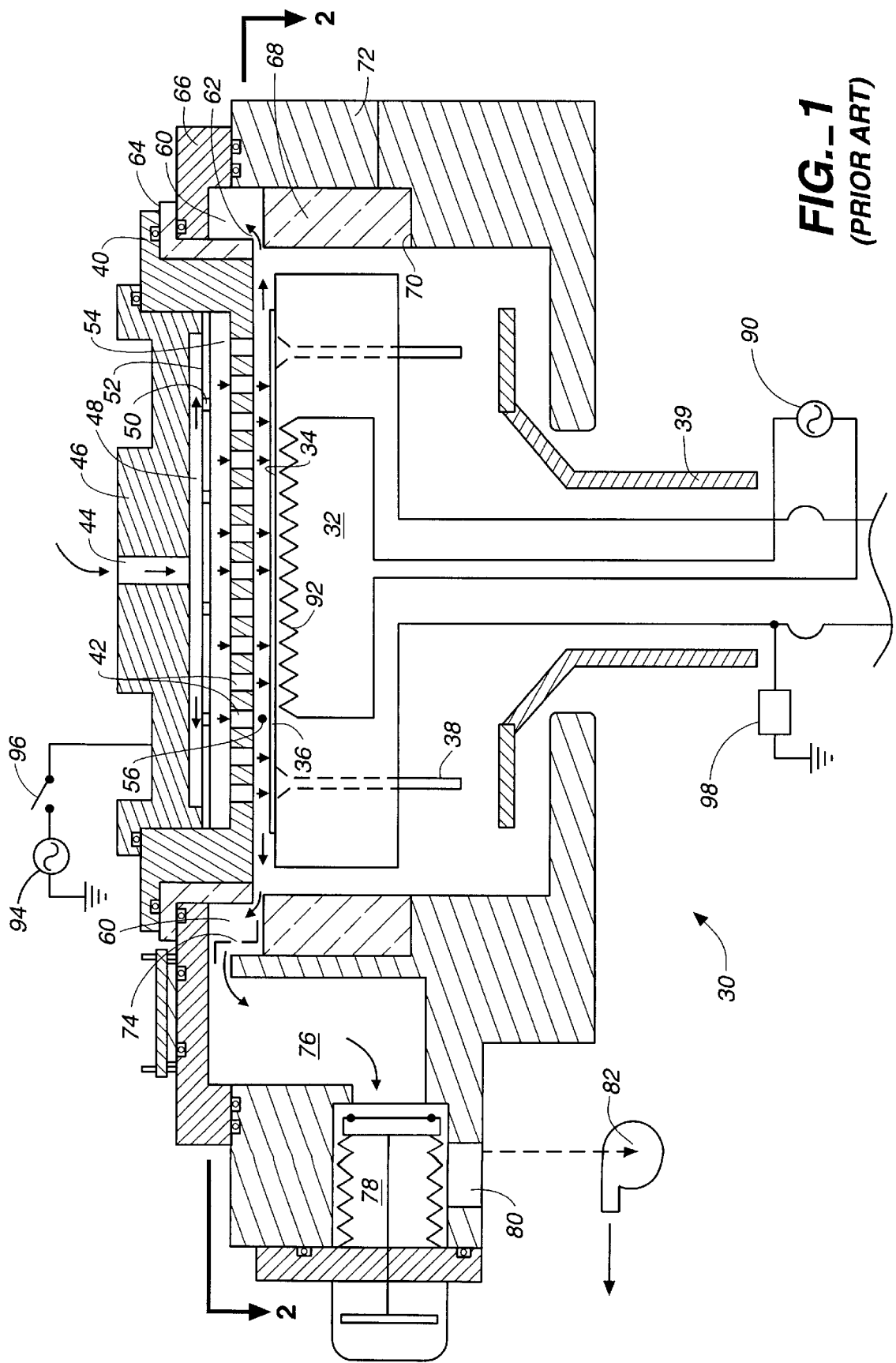
FIG._1 (PRIOR ART)

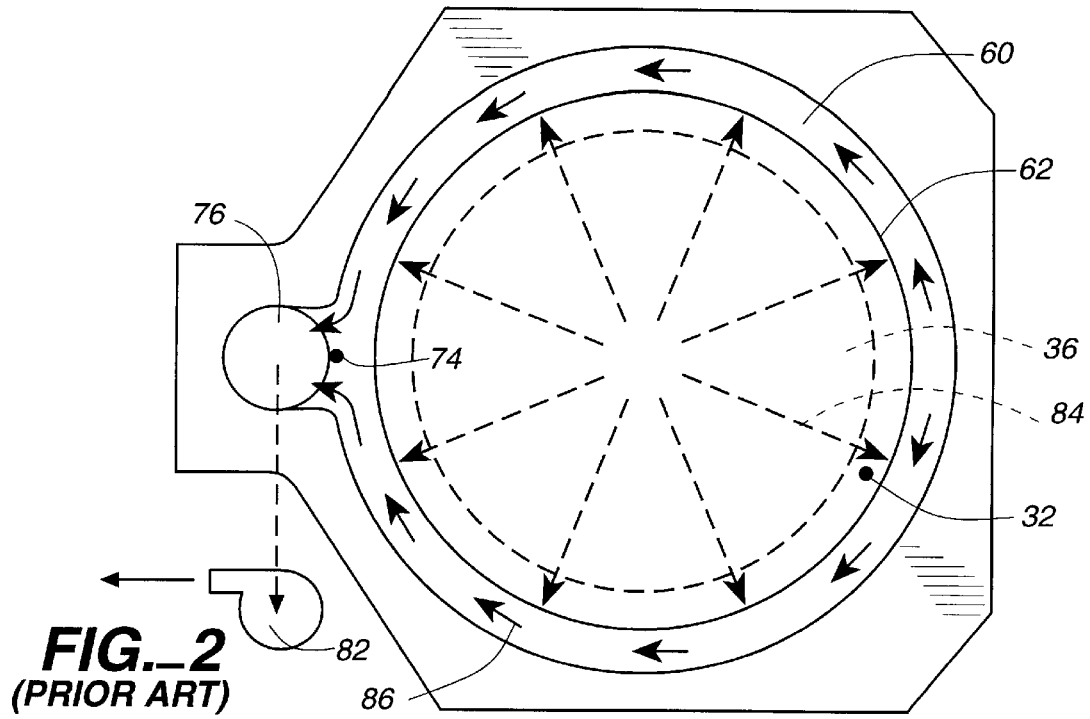
FIG._2 (PRIOR ART)
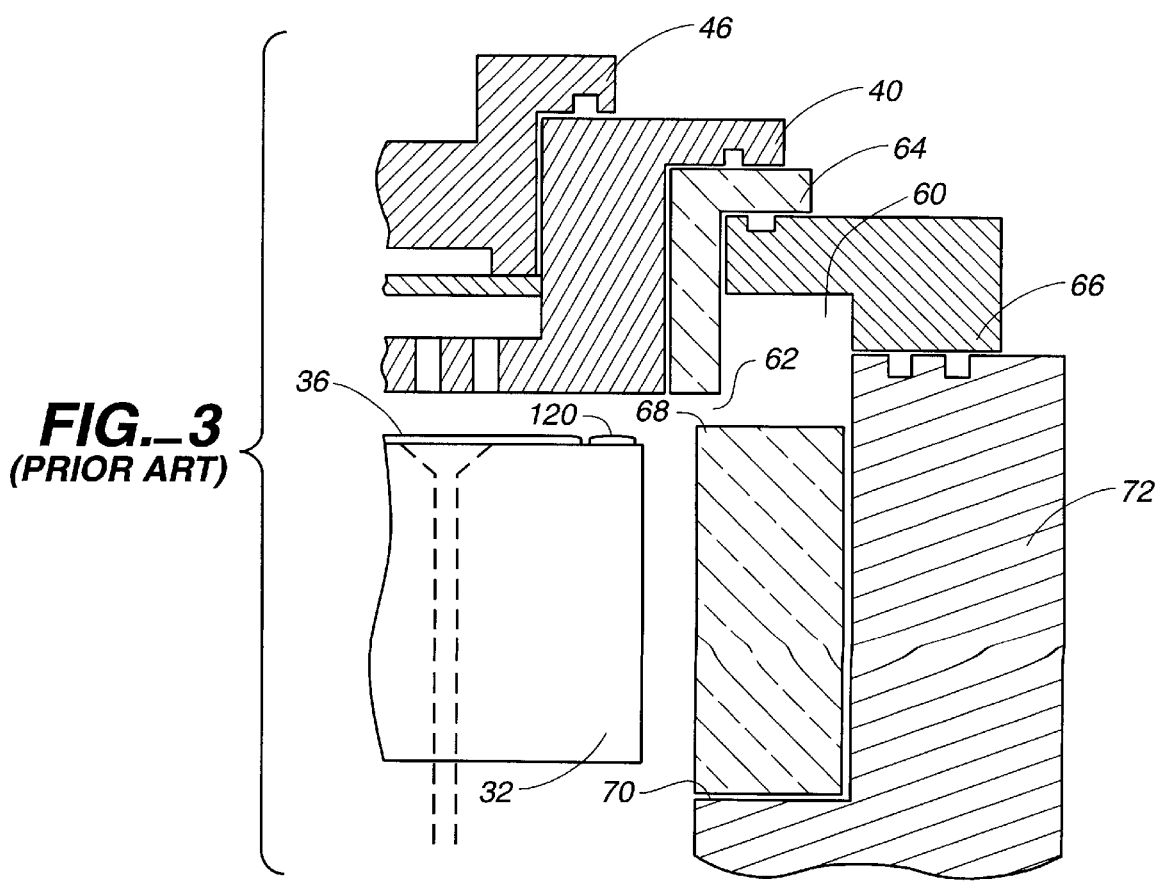
FIG._3 (PRIOR ART)

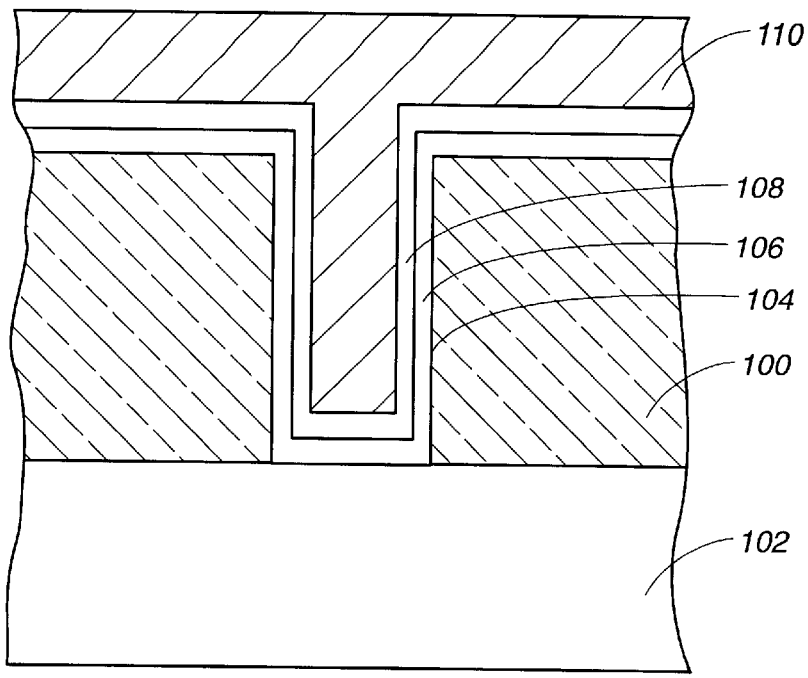
FIG._4
(PRIOR ART)
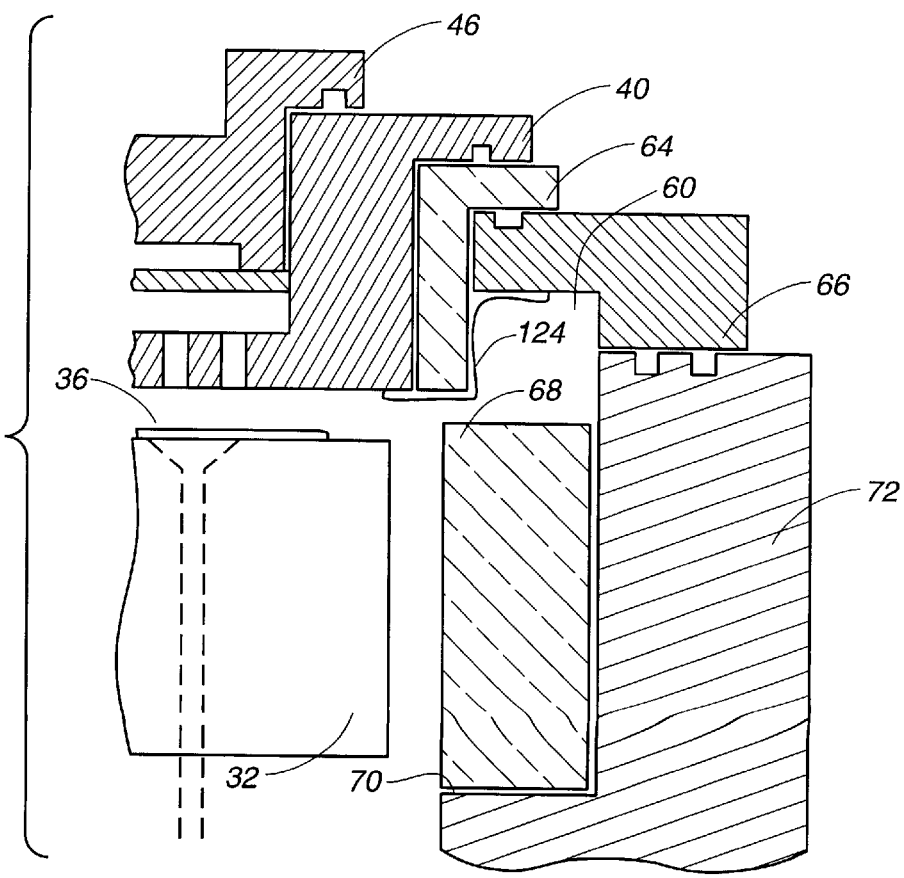
FIG._5
(PRIOR ART)

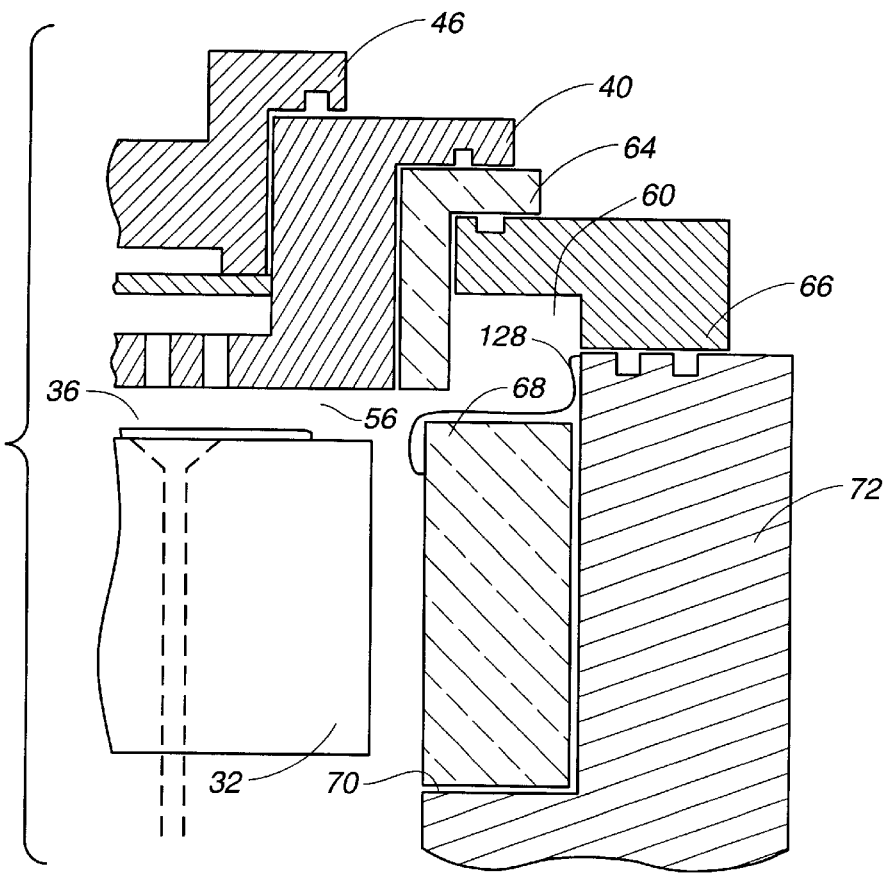
FIG._6
(PRIOR ART)
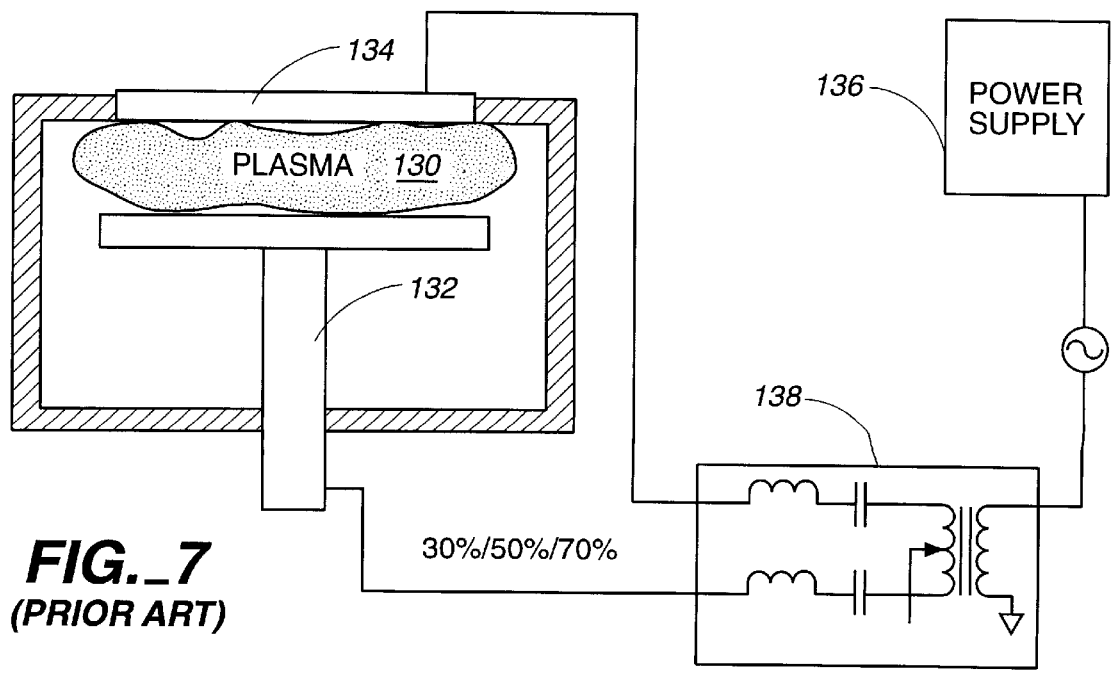
FIG._7
(PRIOR ART)

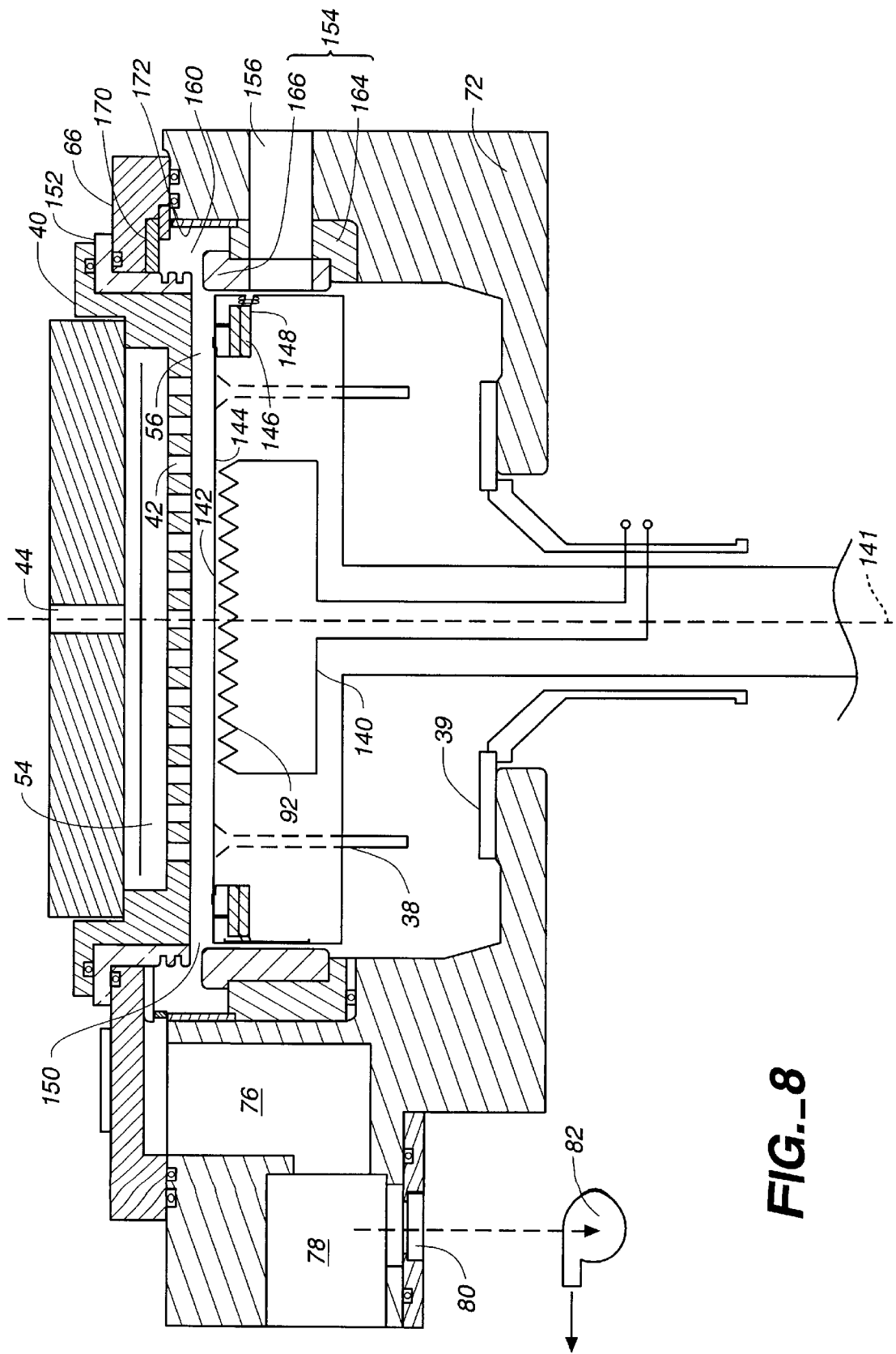
FIG._8

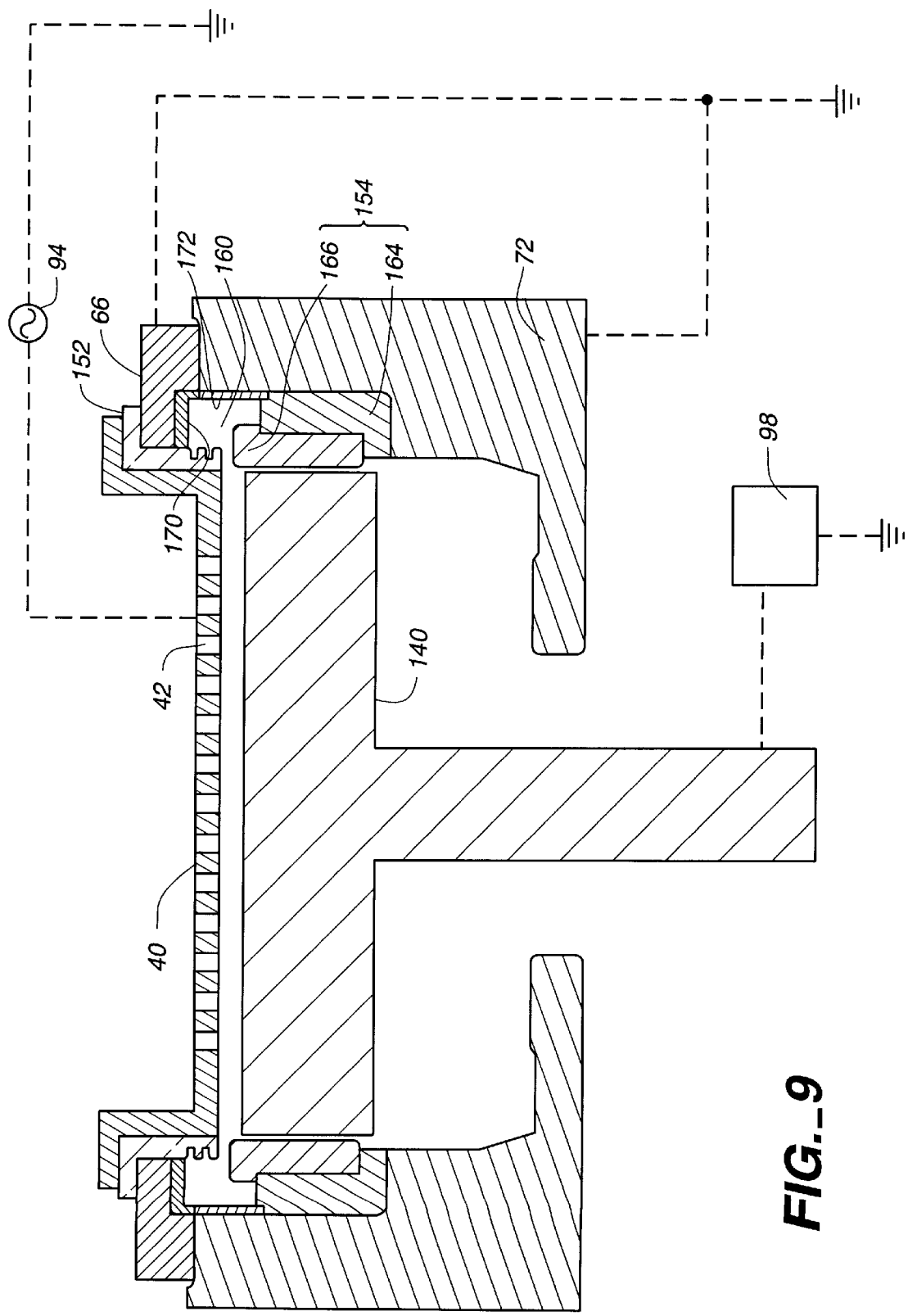
FIG._9

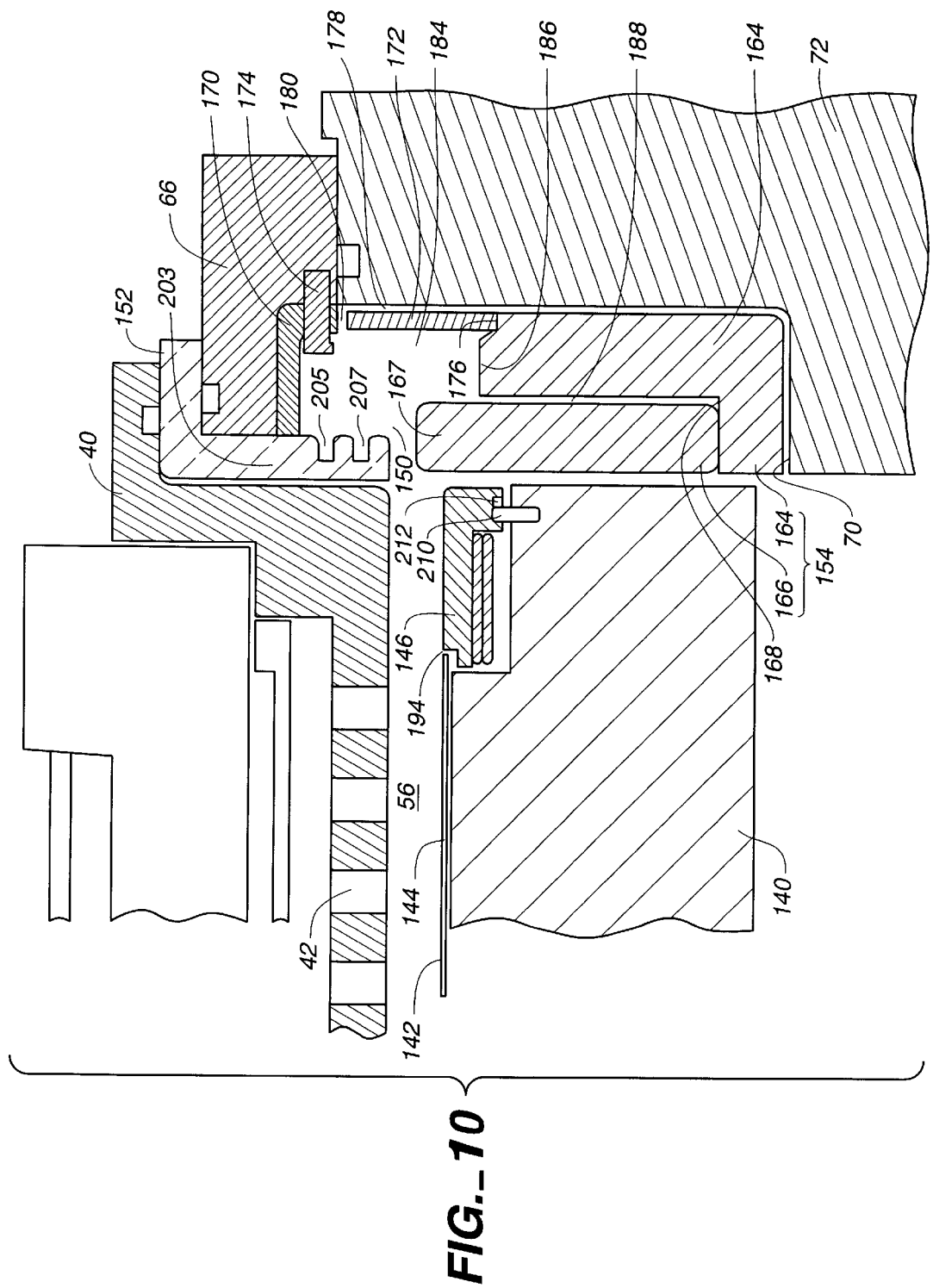
FIG._10

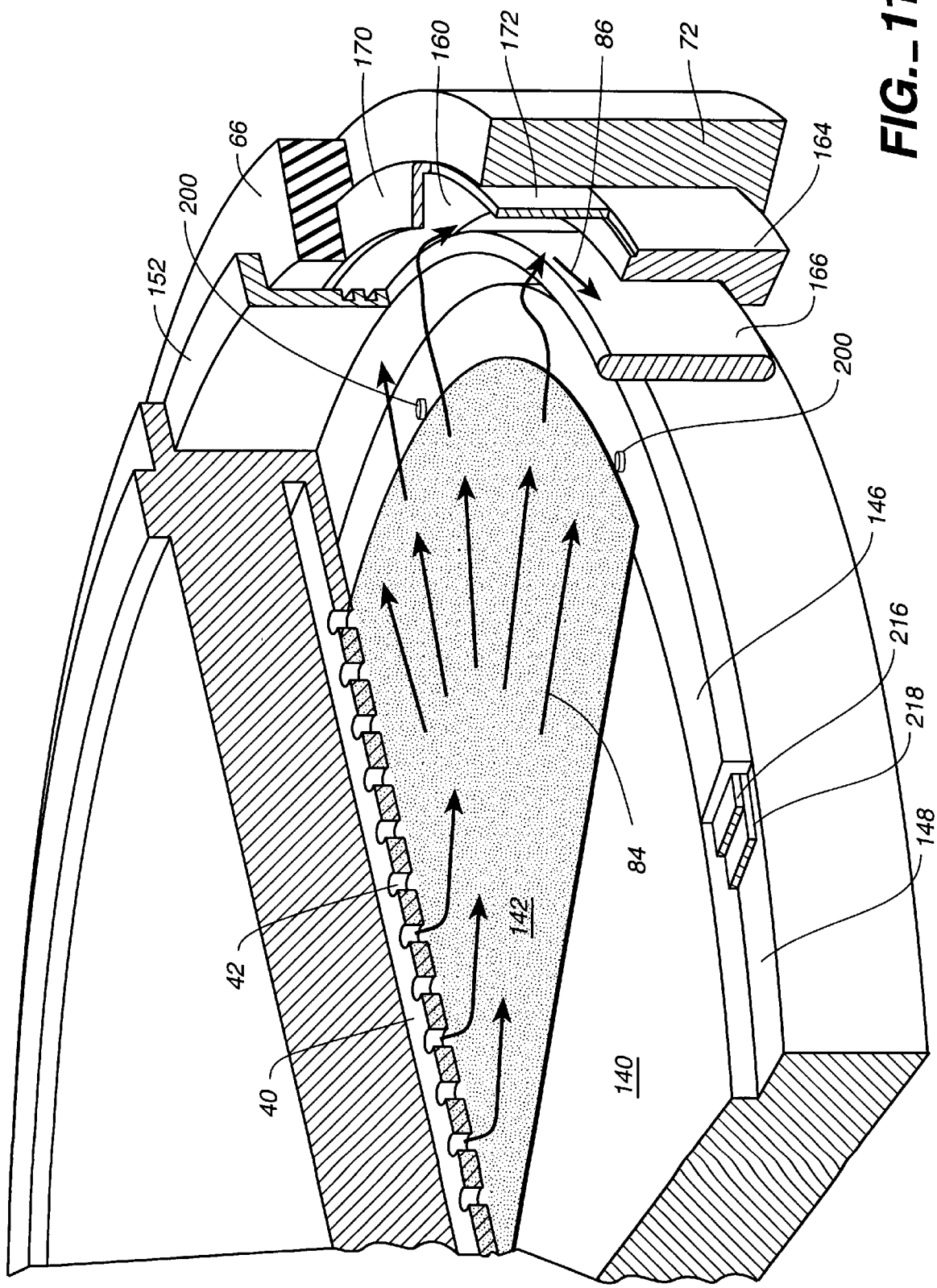
FIG._11

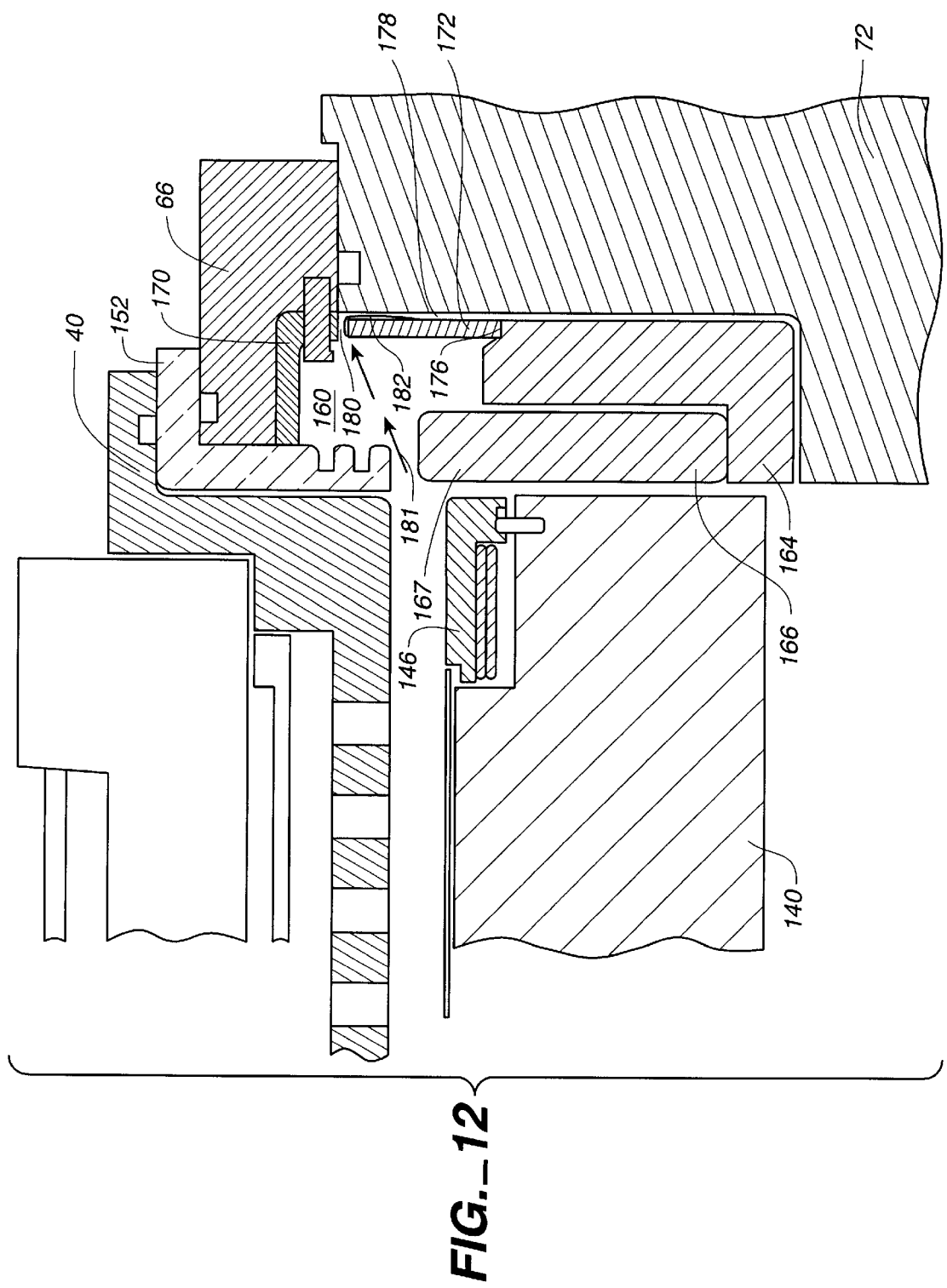
FIG._12

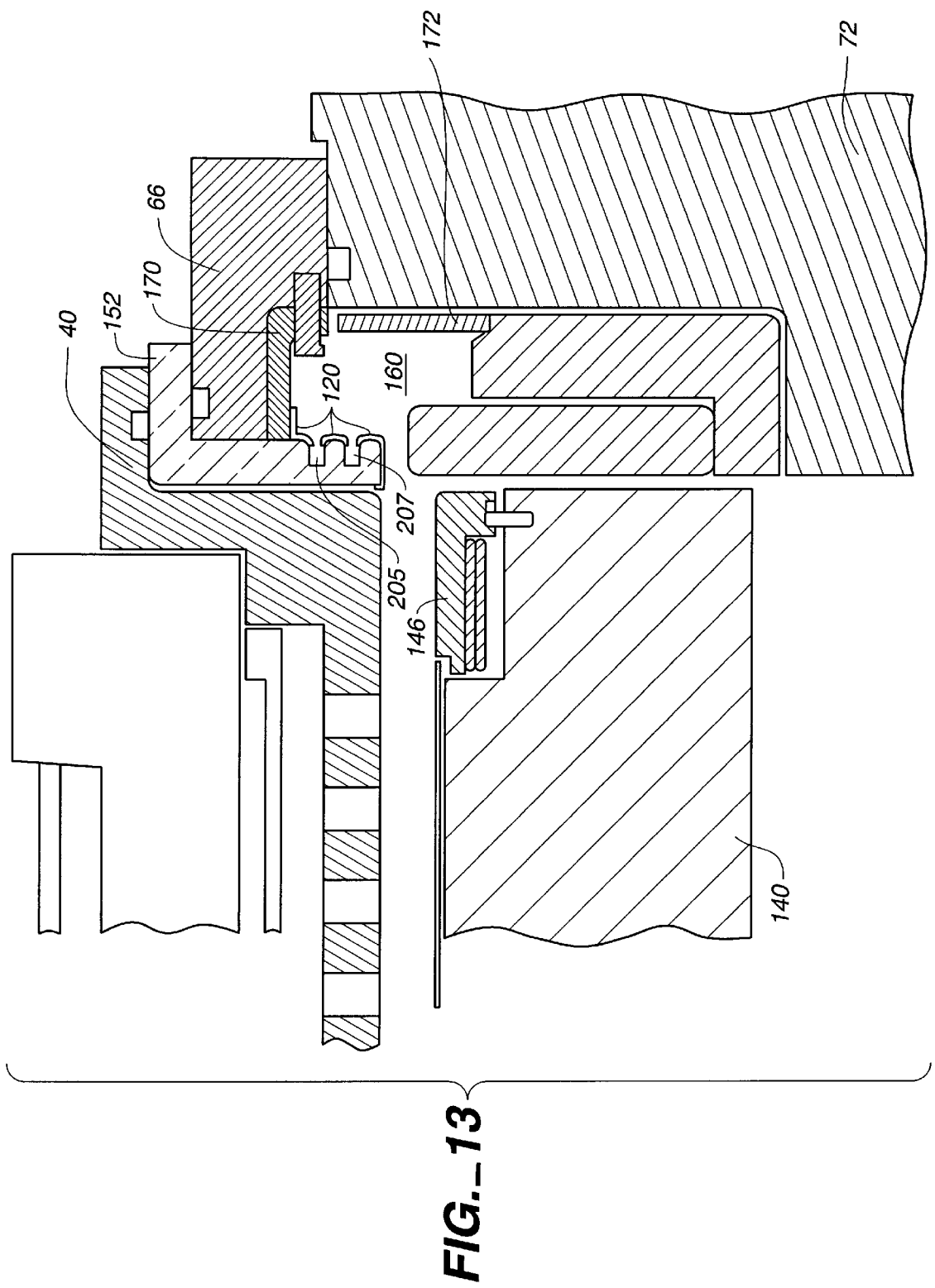

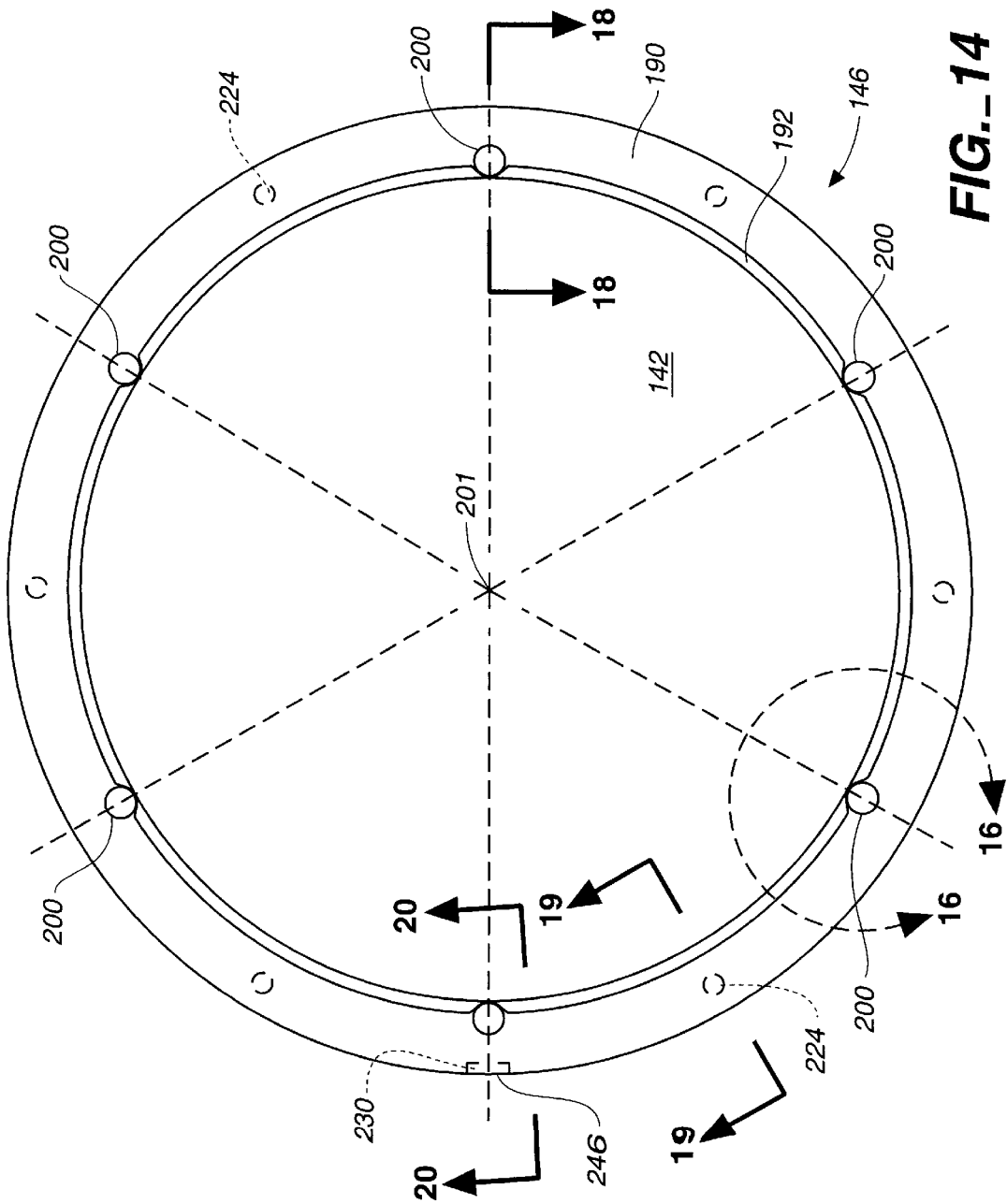
FIG._14

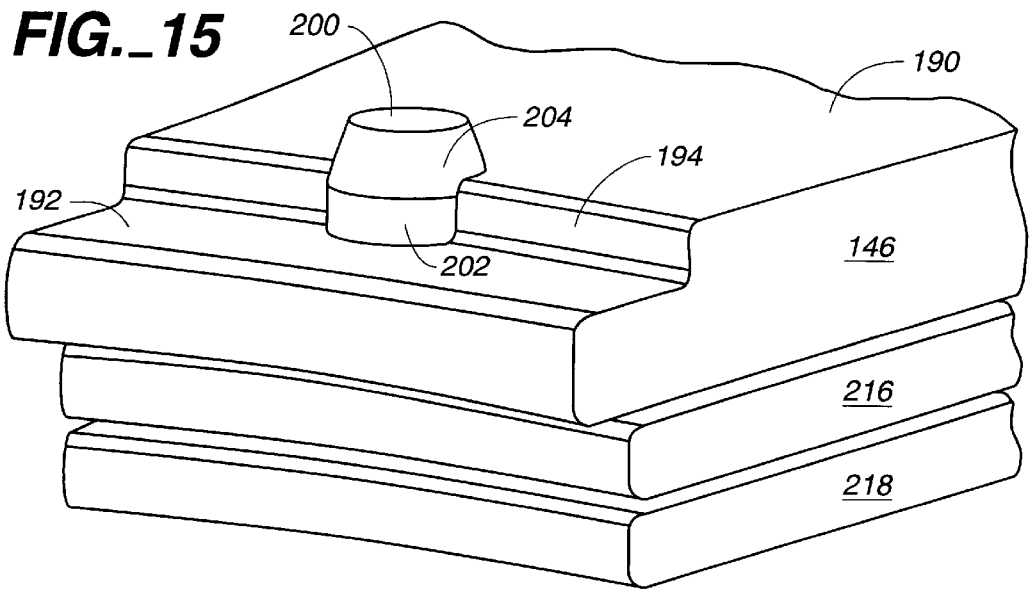
FIG._15
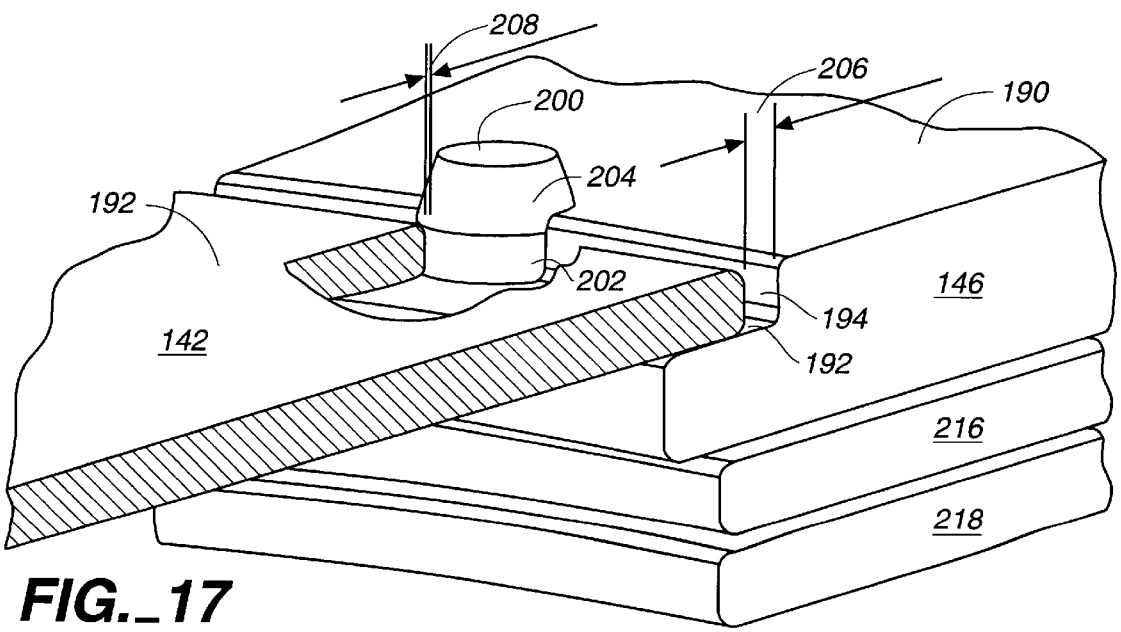
FIG._17

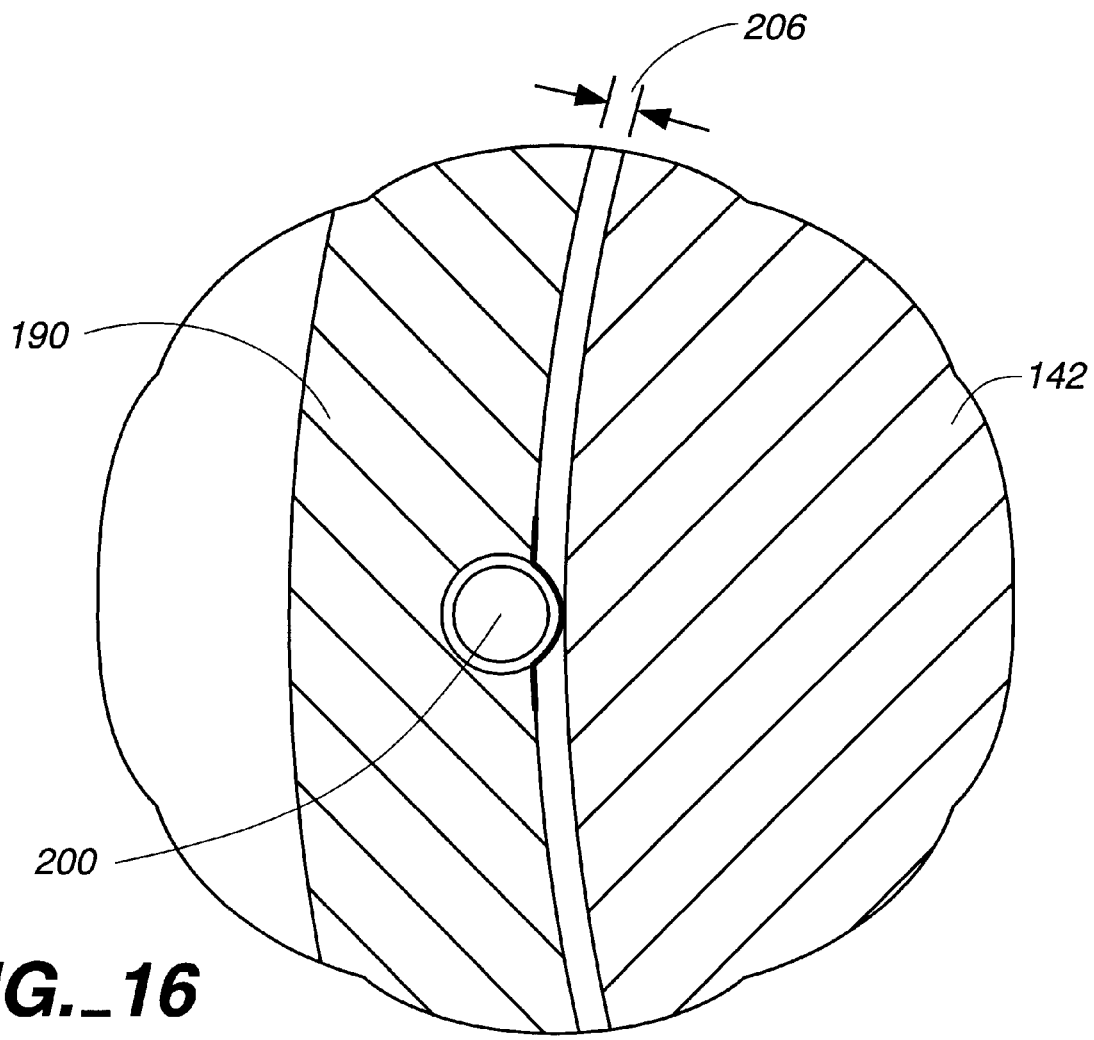
FIG._16

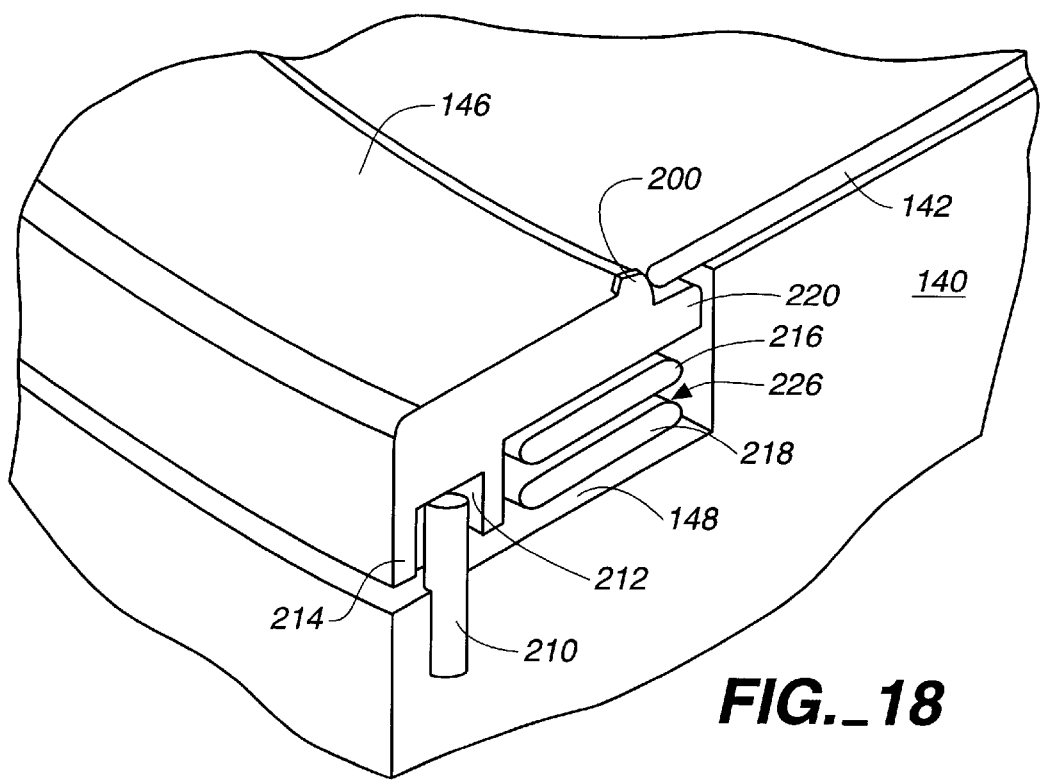
FIG._18
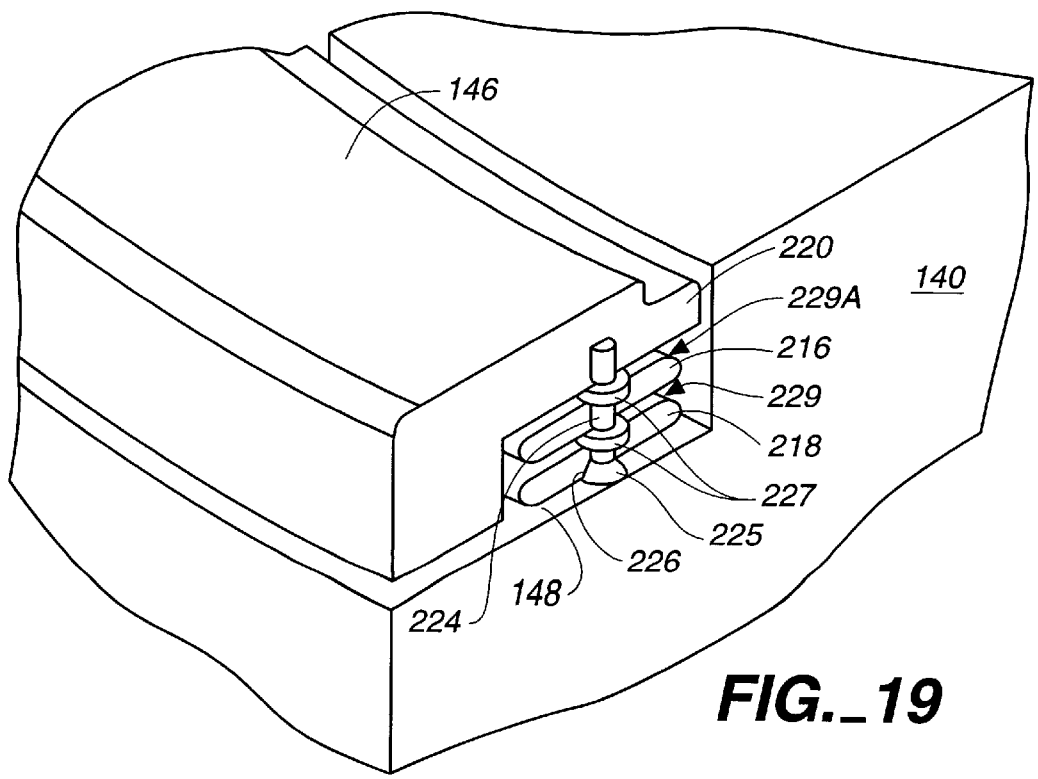
FIG._19

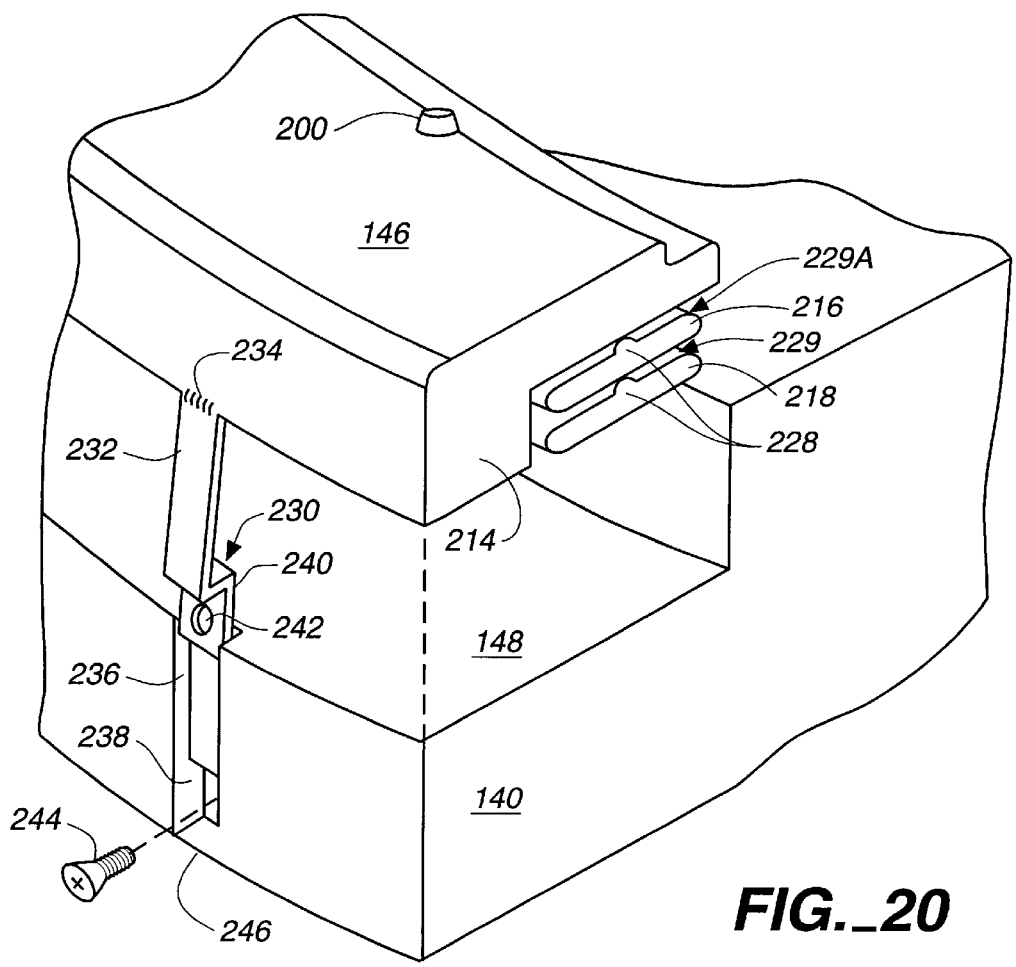
FIG._20
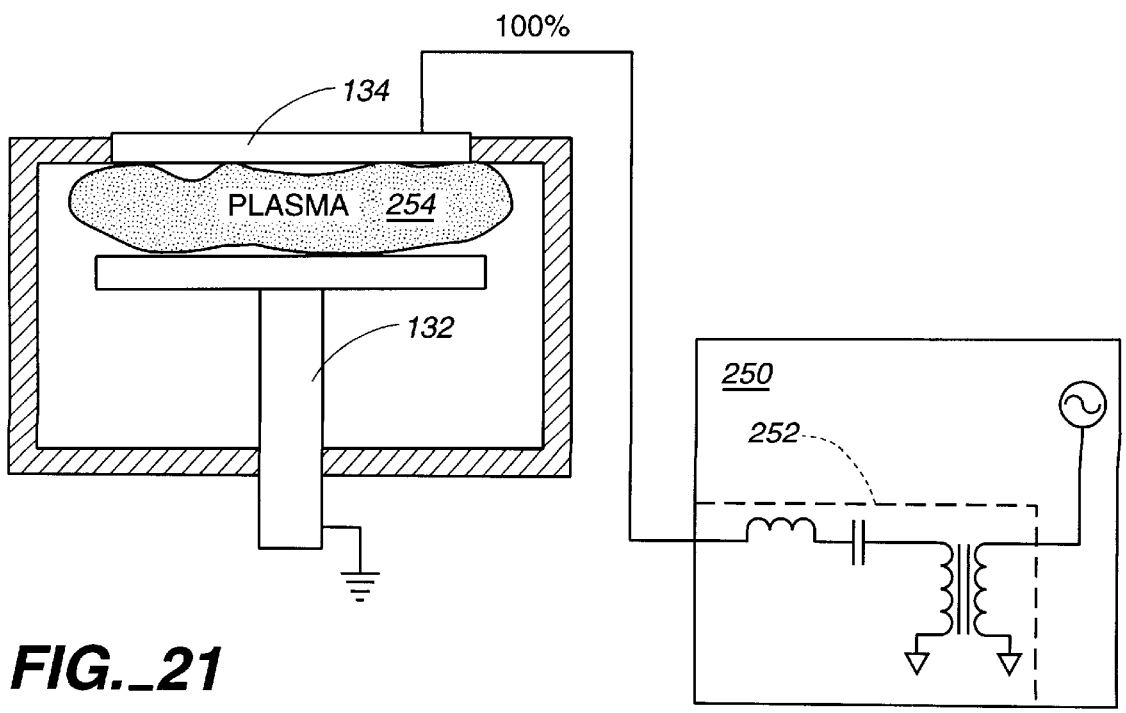
FIG._21

5,964,947

REMOVABLE PUMPING CHANNEL LINERS WITHIN A CHEMICAL VAPOR DEPOSITION CHAMBER

RELATED SPECIFICATION

This application is a divisional of Ser. No. 08/680,724, filed Jul. 12, 1996 now U.S. Pat. No. 5,846,332.

FIELD OF THE INVENTION

This invention relates to semiconductor fabrication equipment. In particular, the invention relates to components used in a plasma reactor for chemical vapor deposition (CVD) pertaining to gas flow through and out of the reactor chamber.

BACKGROUND OF THE INVENTION

Semiconductor integrated circuits are fabricated with multiple layers, some of them patterned, of semiconductive, insulating, and conductive materials, as well as additional layers providing functions such as bonding, a migration barrier, and an ohmic contacts. Thin films of these various materials are deposited or formed in a number of ways, the most important of which in modem processing are physical vapor deposition (PVD), also known as sputtering, and chemical vapor deposition (CVD).

In CVD, a substrate, for example, a silicon wafer, which may already have patterned layers of silicon or other materials formed thereon, is exposed to a precursor gas which reacts at the surface of the substrate and deposits a product of the reaction on the substrate to thereby grow a film thereon. A simple example includes the use of silane ($SiH_4$) to deposit silicon with the hydrogen forming a gaseous byproduct which is evacuated from the chamber. However, the present application is directed more to CVD of a conductive material such as TiN.

This surface reaction can be activated in at least two different ways. In a thermal process, the substrate is heated to a sufficiently high temperature to provide the activation energy for molecules of the precursor gas adjacent to the substrate to react there and deposit a layer upon the substrate. In a plasma-enhanced CVD process (PECVD), the precursor gas is subjected to a sufficiently high field that it forms a plasma. As a result the precursor gas is excited into energetic states, such as ions or radicals, which readily react on the substrate surface to form the desired layered material.

Zhao et al. describe an example of a CVD deposition chamber in U.S. patent application Ser. No. 08/348,273 filed on Nov. 30, 1994, now U.S. Pat. No. 5,558,717, expressly incorporated herein by reference, and which is assigned to a common assignee. This type of CVD chamber is available from Applied Materials, Inc. of Santa Clara, Calif. as the CVD DxZ chamber.

As described in this patent and as illustrated in the cross sectional side view of FIG. 1, a CVD reactor chamber 30 includes a pedestal 32 supporting on a supporting surface 34 a wafer 36 to be deposited by CVD with a layer of material. Lift pins 38 are slidable within the pedestal 32 but are kept from falling out by conical heads on their upper ends. The lower ends of the lift pins 38 are engageable with a vertically movable lifting ring 39 and thus can be lifted above the pedestal's surface 34. The pedestal 32 is also vertically movable, and in cooperation with the lift pins 38 and the lifting ring 39, an unillustrated robot blade transfers a wafer into chamber 30, the lift pins 38 raise the wafer 36 off the robot blade, and then the pedestal 32 rises to raise the wafer 36 off the lift pins 38 and onto its supporting surface 34.

The pedestal 32 then further raises the wafer 36 into close opposition to a gas distribution faceplate 40, often referred to as a showerhead, which includes a large number of passageways 42 for jetting the process gas to the opposed wafer 36. That is, the passageways 42 guide the process gas into a processing space 56 towards the wafer 36. The process gas is injected into the reactor chamber 30 through a central gas inlet 44 in a gas-feed cover plate 46 to a first disk-shaped manifold 48 and from thence through passageways 50 in a baffle plate 52 to a second disk-shaped manifold 54 in back of the showerhead 40.

As indicated by the arrows, the process gas jets from the holes 42 in the showerhead 40 into the processing space 56 between the showerhead 40 and pedestal 32 so as to react at the surface of the closely spaced wafer 36. Unreacted process gas and reaction byproducts flow radially outwardly to an annular pumping channel 60 surrounding the upper periphery of the pedestal 32. The pumping channel 60 is generally closed but on the receiving end includes an annular choke aperture 62 between the pumping channel 60 and the processing space 56 over the wafer 36. The choke aperture 62 is formed between an isolator 64, to be described later, set in a lid rim 66 and an insulating annular chamber insert 68 resting on a ledge 70 on the inside of the main chamber body 72. The choke aperture 62 is formed between the main chamber and a removable lid attached to the chamber so that a fully annular choke aperture 62 can be achieved. The choke aperture 62 has a substantially smaller width than the depth of the processing space 56 between the showerhead 40 and the wafer 36 and is substantially smaller than the minimum lateral dimensions of the circumferential pumping channel 60, for example by at least a factor of five. The width of the choke aperture 62 is made small enough and its length long enough so as to create sufficient aerodynamic resistance at the operating pressure and gas flow so that the pressure drop across the choke aperture 62 is substantially larger than any pressure drops across the radius of the wafer 36 or around the circumference of the annular pumping channel 60. In practice, it is not untypical that the choke aperture 62 introduces enough aerodynamic impedance that the pressure drop from the middle of the wafer 36 to within the pumping channel 60 is no more than 10% of the circumferential pressure drop within the pumping channel 60.

The pumping channel 60 is connected through a constricted exhaust aperture 74 to a pumping plenum 76, and a valve 78 gates the exhaust through an exhaust vent 80 to a vacuum pump 82. The constricted exhaust aperture 74 performs a function similar to that of the choke aperture 62 in introducing an aerodynamic impedance such that the pressure within the pump channel 60 is substantially constant.

The restricted choke and exhaust apertures 62, 74 create a nearly uniform pressure around the circumferential pumping channel 60. The resultant gas distribution flow pattern across the wafer 36 is shown in arrowed lines 84 in FIG. 2. The process gas and its reaction byproducts flow from the center of the showerhead 40 across the wafer 36 and the periphery of the pedestal 32 along radial paths 84 and then through the choke aperture 62 to the pumping channel 60. The gas then flows circumferentially along paths 86 in the pumping channel 60 to the exhaust aperture 74 and then through the exhaust plenum 76 and the exhaust vent 80 to the vacuum pump 82. Because of the restrictions 62, 74, the radial flow 84 across the wafer 36 is nearly uniform in the azimuthal direction.

As shown in FIGS. 1 and 3 (FIG. 3 being a closeup view of the upper right corner of FIG. 1), the ledge 70 in the chamber body 72 supports the chamber shield liner 68, which forms the bottom of the pumping channel 60. The chamber lid rim 66 forms the top and part of the outside wall of the pumping channel 60 along with part of the chamber body 72. The inside upper edge of the pumping channel 60 is formed by the isolator ring 64, which is made of a ceramic or other electrically insulating material which insulates the metallic showerhead 40 from the chamber body 72.

The CVD reactor chamber 30 of FIG. 1 can be operated in two modes, thermal and plasma-enhanced. In the thermal mode, an electrical power source 90 supplies power to a resistive heater 92 at the top of the pedestal 32 to thereby heat the pedestal 32 and thus the wafer 36 to an elevated temperature sufficient to thermally activate the CVD deposition reaction. In the plasma-enhanced mode, an RF electrical source 94 is passed by a switch 96 to the metallic showerhead 40, which thus acts as an electrode. The showerhead 40 is electrically insulated from the lid rim 66 and the main chamber body 72 by the annular isolator ring 64, typically formed of an electrically non-conductive ceramic. The pedestal 32 is connected to a biasing element 98 associated with the RF source 94 so that RF power is split between the showerhead 40 and the pedestal 32. Sufficient voltage and power is applied by the RF source 94 to cause the process gas in the processing space 56 between the showerhead 40 and the pedestal 32 to discharge and to form a plasma.

Only recently has it been attempted to use this general type of CVD reactor to deposit a film of a conductive material, such as titanium nitride (TiN), using the thermal TDMAT process described by Sandhu et al. in U.S. patent application, Ser. No. 07/898,059. A related plasma process is described by Sandhu et al. in U.S. Pat. No. 5,246,881. The deposition of a conductive material in this chamber has presented some problems that are addressed by this invention.

Titanium nitride is a moderately good electrical conductor, but in semiconductor processing it is used primarily to function as a barrier layer and to assist titanium as a glue layer. This process is often applied to the contact structure illustrated in the cross-sectional view of FIG. 4 in which an oxide layer 100, typically $SiO_2$, is deposited to a thickness of about 1 $\mu$m over a substrate 102 having a surface of crystalline silicon or polysilicon. The oxide layer 100 acts as an inter-level dielectric, but to provide electrical contact between levels a contact hole 104 is etched through the oxide layer 100 to be filled with a metal such as aluminum. However, in advanced integrated circuits, the contact hole 104 is narrow, often less than 0.35 $\mu$m, and has an aspect ratio of 3 or more. Filling such a hole is difficult, but a somewhat standard process has been developed in which the hole 104 is first conformally coated with a titanium layer 106, and the titanium layer 106 is then conformally coated with a titanium nitride layer 108. Thereafter, an aluminum layer 110 is deposited, usually by physical vapor deposition, to fill the contact hole 104 and to provide electrical interconnection lines on the upper level. The Ti layer 106 provides a glue layer to both the underlying silicon and the oxide on the sidewalls. Also, it can be silicided with the underlying silicon to form an ohmic contact. The TiN layer 108 bonds well to the Ti layer 106, and the aluminum layer 110 wets well to the TiN so that the aluminum can better fill the contact hole 104 without forming an included void. Also, the TiN layer 108 acts as a barrier to prevent the aluminum 110 from migrating into the silicon substrate 102 and affecting its conductivity. In a via structure in which the substrate 102 includes an aluminum surface feature, the Ti layer 106 may not be needed. Even though the electrical conductivities of titanium and titanium nitride are not nearly as high as that of aluminum, they are sufficiently conductive in thin layers to provide a good electrical contact.

Titanium and titanium nitride can be deposited by either CVD or PVD, but CVD enjoys the advantage of more easily forming conformal layers in a hole having a high aspect ratio. The thermal TDMAT process is such a CVD process for conformally coating TiN in a narrow hole.

In the TDMAT process, a precursor gas of tetrakis-dimethylamido-titanium, $Ti(N(CH_4)_2)_4$, is injected into the chamber through the showerhead 40 at a pressure of about 1 to 9 Torr while the pedestal 32 holds the substrate 36 at an elevated temperature of about 360° C. or higher. Thereby, a conductive and conformal TiN layer is deposited on the substrate 36 in a CVD process. The TDMAT process is a thermal process not usually relying upon plasma excitation of the precursor gas.

However, it has been found that the TiN layer initially formed by the TDMAT process includes an excessive amount of carbon in the form of included polymers which degrade its conductivity. Thus, the TDMAT deposition is usually followed by a second step of plasma treating the deposited TiN layer. The TDMAT gas in the chamber is replaced by a gas mixture of $H_2$ and $N_2$ in about a 50:50 ratio at a pressure of 0.5 to 10 Torr, and the RF power source 94 is switched on to create electric fields between the showerhead 40 and the pedestal 32 sufficient to discharge the $H_2$:$N_2$ gas to form a plasma. The hydrogen and nitrogen species in the plasma reduce the carbonaceous polymer to volatile byproducts which are exhausted from the system. The plasma treatment thereby removes the carbon to improve the quality of the TiN film.

The plasma treatment process, when performed in the same chamber as the thermal CVD deposition, has demonstrated some problems with uniformity and reproducibility. We believe that the problems originate from extraneous metal depositions on reactor surfaces affecting the plasma and producing excess particles within the chamber. We also believe that the depositions occur in two different areas, an area at the top of the pedestal 32 outside of the wafer 36 and an area in and around the pumping channel 60.

A first problem, we believe, relates to extraneous metal deposition on the pedestal 32 because exposed portions of the pedestal 32 are at a temperature equal to and often much greater than that of the wafer 36. As shown in the cross-sectional view of FIG. 3, the portion of the pedestal 32 which extends beyond the outside edge of the wafer 36 is subject to a buildup 120 of deposited material from the following mechanism.

During the thermal phase of the TDMAT process during which the conductive TiN is deposited, the heater 92, shown in FIG. 1, installed in the pedestal 32 heats the pedestal 32, and the heat is transferred thence to the wafer 36. There are several reasons why the exposed portion of the pedestal 32 tends to be at a significantly higher temperature than that of the wafer 36. The showerhead 40 operates at a much lower temperature, typically around 100° C. to readily sink heat from opposed elements. On the other hand, the wafer 36 is incompletely heat sunk on the pedestal 32 and transmits heat conducted to it from the pedestal 32 more poorly than does the directly radiating and more highly thermally conductive pedestal 32. Also, since the chamber is also used for the low-temperature plasma treating phase and additional time is consumed transferring wafers into and out of the chamber, the duty cycle for the high-temperature operation is relatively low and it is necessary to heat the wafer 36 to the required high processing temperatures. To quickly raise the temperature of the wafer 36 to its processing temperature, the temperature of the pedestal 32 is raised to a higher temperature than that of the wafer 36. For all these reasons, the processing temperature of the wafer 36 may be set to 360° C. while the exposed portion of the pedestal tends to be at a significantly higher temperature of 425° C.

Since the rate of deposition on a surface is proportional to the temperature of the surface (the higher the temperature the more rapid the deposition), the higher temperature of the exposed outer edge of the pedestal 32 causes, as illustrated in FIG. 3, a rapid buildup 120 of deposited film. As the thickness of the deposited film increases over the processing cycles of many wafers, deleterious effects may occur. The buildup of film thickness at the edge may create an artificial perimeter rim which prevents the wafer 36 from being in full contact with the surface of the pedestal 32, as required for efficient processing. Similarly, once the buildup 120 has developed past some film thickness of the film, successively deposited film layers do not completely adhere to the underlying layers. Portions of the film can then form particles or flakes that separate from the pedestal and float onto the wafer 36 being processed. The particles can create defects on the processed wafer.

A second problem related to extraneous metal deposition arises in that the conductive TiN film is also deposited, to a lesser extent because of lower surface temperatures, on other surfaces exposed to the process gas along its path from the showerhead 40 to and through the pumping channel 60 on its way to the chamber vacuum system 82. FIG. 5 shows an example of the buildup of a metal film 124 over and around the isolator ring 64 that can cause an electrical short between the electrically biased showerhead 40 and the grounded lid rim 66. FIG. 5 shows only an exaggerated film buildup 124 on the upper surface of the chamber. In reality, the film builds up on all surfaces, but the other buildup is not shown for clarity.

Another example of extraneous film deposition illustrated in FIG. 6 is the buildup of a conductive film 128 over the insulating alumina chamber insert 68 to the point that it extends across the pumping channel 60 and contacts the electrically grounded main chamber body 72. This extraneous deposition 128 thus extends the ground potential associated with the chamber body 72 and the lid rim 66 to the inner, upper edge of the insulating annular insert 68 closely adjacent the upper peripheral edge of the pedestal 32. The location and quality of plasma in the processing space 56 depends on the distance between the powered plasma source electrodes and surrounding surfaces and the difference between their respective electrical potentials. When, during a long process run, the chamber insert 68 effectively changes from being disposed as a insulator between the chamber body 72 and the plasma to being a grounded conductor, the location and quality of the plasma will be affected, particularly around the edges of the wafer 36. The distortion of the plasma due to the proximity of a closely adjacent electrical ground causes non-uniformity in the plasma, which affects the thickness of the film deposition and its surface properties.

During plasma processing, variations in uniformity of the plasma will affect the surface uniformity of the film produced. Therefore, variations in the intensity of the plasma will affect the uniformity of film properties. The conductivity, which is the inverse of the insulating quality, of the insulating members surrounding the location of the plasma changes as a conductive film is formed on their surfaces and as the conductive film forms a conductive path to adjacent conductive elements at different potentials. This variation in the conductive quality of the ostensibly insulating elements causes variations in the plasma which reduce the process repeatability.

A third problem related to extraneous metal deposition arises in that some electrically floating elements which are exposed to the plasma will accumulate a charge from the plasma. In the instance where these charged pieces are close to a grounded or electrically powered part, there is always a chance of arcing between the floating part and a ground or the electrode. In the instance when the wafer is supported on the pedestal, the wafer may act as a floating element which can become charged to cause arcing. Arcing creates particles and defects in the substrate. Therefore arcing to the wafer should be avoided and the uniformity of the envelope for the plasma treating the surface of the substrate should be held as uniform as possible.

To avoid these potentially deleterious effects, it is common practice to schedule a cleaning or maintenance cycle involving removal and replacement or cleaning of the pedestal before buildup of film can create undesired effects. However, this remedy is disadvantageous. Not only are pedestals expensive, but their replacement or cleaning involves a shut down of expensive equipment and additional operator time.

The buildup of unwanted film thickness on either the perimeter of the susceptor or across insulating members in the chamber requires they be periodically cleaned to prevent short-circuiting or unacceptable variations in the plasma treatment. The buildup of a thickness of an unwanted film creates a risk of short-circuiting by causing variations in the intensity and location of the electrical fields exciting the gas to a plasma state. Also, when the risk of conduction or arcing becomes high, a cleaning or maintenance cycle is initiated to restore the original distribution of the electrical field. Other consumable or maintainable components also require replacement or cleaning at certain intervals. Presently the risk of conductance and arcing sets the cleaning/maintenance interval. The mean number of wafers between cleans could be increased dramatically if the problem of film thickness adherence and conductivity across insulating members to grounded members, as described above, could be reduced or eliminated.

A CVD chamber, schematically illustrated in FIG. 7, is similar to that of FIG. 1 except that it is radiantly, not resistively, heated. It has been applied to the deposition of conductive materials and where plasma treatment of one sort or another was performed in the chamber. In this chamber, an argon treatment sputtering gas was energized into a plasma 130 between a pedestal electrode 132 and a counter electrode 134. An RF power source 136 provided RF power to energize the plasma. It was found, however, that, if the plasma was to be well confined in the processing space above the wafer, it was necessary to feed the RF power to a matching network 138 that selectably split the power between the pedestal electrode 132 and the counter electrode 134. It is believed that thus splitting the RF power better confines the plasma because the plasma with a grounded electrode tends to spread outside of the area of the wafer and to be more affected by the extraneously deposited metal layers described above. The matching network 138 allowed the RF power split to the pedestal electrode 132 to be the fraction of 30%, 50%, or 70% of the total power.

It is desired that CVD chambers of the type shown in FIG. 1, which were designed for deposition of dielectrics, be adapted to allow them to deposit metallic materials.

Therefore, it is desired that this chamber be improved to alleviate the problems of plasma instability and arcing. It is further desired that the frequency for routine maintenance and cleaning be reduced.

SUMMARY OF THE INVENTION

This invention extends the mean number of wafers between cleans by improving the performance of a semiconductor substrate processing chamber, for example, a chamber for depositing titanium nitride.

The performance is improved by reducing the tendency of the deposition gas to form an excessive buildup on the portion of the susceptor extending beyond the edge of the substrate being processed. Reducing the temperature of a peripheral ring surrounding the outer edge of the substrate being processed reduces the buildup.

The invention includes a peripheral ring on the substrate support pedestal which is thermally isolated from the pedestal and the substrate being processed. The peripheral ring includes centering bosses extending above the ring which assist in centering the substrate as it is lowered to the surface of the support pedestal. The centering bosses provide a series of protruding features extending inward from the inside perimeter edge of the ring facing the substrate. These protrusions potentially are the only part of the peripheral ring in contact with the substrate, thereby providing a minimum of surface contact (and potential for conductive heat transfer) between the substrate and the peripheral centering ring.

The peripheral centering ring is thermally isolated from the pedestal by being supported on pins at only three locations around the periphery thereby reducing the conductive heat transfer from the pedestal to the peripheral centering ring. The thermal isolation from the pedestal is further achieved by providing a series of isolator rings or radiation shields (for example, two) which are attached to the bottom side of the peripheral ring. The radiation shields act as barriers to prevent the direct transmission of thermal radiation from the pedestal to the peripheral centering ring. The lower temperature of the peripheral ring as a result of this thermal isolation causes a lower rate of vapor film deposition on its surface and increases the mean number of wafers between cleaning cycles for the processing chamber. The separate peripheral ring can easily be removed and replaced during a maintenance cycle of the processing chamber.

The peripheral ring being thermally isolated from the pedestal is subject to a buildup of static charge which can result in arcing to and from the wafer and/or other adjacent surfaces. The invention includes a grounding strap between the peripheral ring and the pedestal to eliminate arcing between the peripheral ring and the substrate or other adjacent surfaces. The ground strap is flexible and is mounted in a recessed slot on the perimeter of the susceptor such that the ground strap does not provide a protrusion which extends beyond the normal nominal perimeter of the susceptor.

Performance is also improved by reducing and nearly eliminating the likelihood that a continuous conductive film will be formed across insulating elements within the chamber. A continuous choke gap is created in and between adjacent elements having different electrical potentials across which a conductive film might create a change in insulating properties.

An isolating member (ring) in the lid of the processing chamber, includes a series of continuous choke gap surface features (grooves) which prevent the formation of continuous conductive film on the surface of the isolation member. The film formed on the surface is not continuous and therefore does not provide a conductive path from the gas distribution faceplate/electrode to ground. Electrical or charge conduction and/or leakage to ground will eliminate or reduce the electrical field needed to form a uniform plasma and to provide uniform processing of substrates through consecutive processing cycles.

To reduce the possibility of grounding of the metal shield surrounding the plasma region, a (second) continuous choke gap is created around the processing chamber between a second shield element and the chamber body. While the gap is still susceptible to having conductive films being formed therein, the width and depth of the gap prevents the surface film from forming a conductive bridge or connection across the gap or within the gap.

Performance is further improved by providing an electrically floating conductive element surrounding the plasma location to stabilize the edge of the plasma envelope. In one instance a metal shield, which is electrically floating, lines a portion of a wall of the substrate processing chamber. The shield becomes coated during vapor deposition, but process stability is maintained because the shield is electrically isolated from surrounding conductive elements. The shield provides a barrier to passage of the plasma. The static charge on the conductive (metal) shield is uniformly distributed across it and as a result the edge of the plasma envelope is stabilized.

Another improvement involves using RF power provided exclusively to the upper electrode (the gas distribution plate) while the lower electrode (susceptor) is grounded. This 100% to 0% power splitting proves an improvement in the uniform properties of film in a chamber performing a TiN film deposition.

The invention includes a method of isolating a peripheral ring in a susceptor extending beyond the edge of the substrate, including steps of providing a series of support point features from the top of the susceptor and providing a radiation shield ring shielding a portion of the peripheral ring from direct exposure to the susceptor. Another method includes the steps of providing a grounding strap that is electrically connected to the peripheral ring and removably attaching a portion of the grounding strap to the susceptor. Another method of the invention includes the steps of providing an isolator ring exposed at least on one side to the atmosphere of the processing chamber between an RF powered electrode and an electrically conductive element having an electrical potential different from the RF powered electrode, and providing a continuous choke gap in the surface of the isolator member facing the atmosphere of the processing chamber. Another feature of the invention includes a method including the steps of providing a shield supported by an insulating member within the process chamber and providing a clearance between the inner shield member and a grounded surface such that a film forming on the surface will not bridge the gap to provide conductivity.

The invention also includes a method of providing power to a TiN vapor deposition chamber including the steps of connecting an electrode gas distribution plate to a power source and connecting a susceptor opposite the electrode gas distribution plate to the electrode to a ground potential.

This invention provides improvements which reduce the chance of arcing between floating charged elements in the processing chamber adjacent to the location where plasma is formed, reduce the temperature of the peripheral ring to avoid excessive deposition on the part of the susceptor outside the substrate, provides a constant potential across the substrate to eliminate arcing between its peripheral/centering ring and the susceptor and eliminates or substantially reduces the likelihood that any film formed by the vapor deposition on the chamber walls will result in a short circuit connection between the RF electrode and a chamber body or lid. The invention also includes the positioning of a metal (uniform electrical potential distribution ring) around the region of the plasma to contain the plasma and help keep it stable with a relatively constant ion potential across the wafer.

BRIEF DESCRIPTION OF THE DRAWINGS

FIG. 1 is a cross-sectional view of a prior-art CVD processing chamber.

FIG. 2 is a cross-sectional view of FIG. 1 taken at 2—2 showing the gas flow distribution across the substrate being processed and the gas flow in the pumping channel.

FIG. 3 is an schematical closeup view of the upper right hand corner of the chamber as shown in FIG. 1.

FIG. 4 is a cross-sectional view of an integrated-circuit structure which the apparatus of the invention can be used to make.

FIG. 5 is a copy of FIG. 3 showing a conductive film formed on the upper surfaces of the chamber.

FIG. 6 is a copy of FIG. 3 showing a film deposited on the pumping channel protruding into the area exposed to plasma in the chambers.

FIG. 7 shows the power splitting energization for prior art TiN chambers.

FIG. 8 is a cross-sectional of a processing chamber according to the invention.

FIG. 9 is a schematical cross section of the processing chamber of FIG. 8 showing the interrelationship between the electrical potentials of the structures according to the invention and emphasizing other features.

FIG. 10 is an enlarged view of the upper right hand corner of FIGS. 8 and 9.

FIG. 11 is a perspective cutaway view of the cross section of FIG. 8 showing the interrelationship of various structures of the invention.

FIG. 12 copies FIG. 10 and shows the build up of a conductive film around a pumping channel liner of the invention.

FIG. 13 copies FIG. 10 and shows the build up of a conductive film on the novel isolator ring of the invention as would occur from gas traveling from the gas distribution faceplate to the vacuum evacuation system through the pumping channel.

FIG. 14 is a top view of a circular substrate located in a centering ring of a susceptor according to the invention.

FIG. 15 shows a partially sectioned perspective view of a centering boss as part of the centering ring according to the invention.

FIG. 16 shows a closeup plan view of a section of the centering ring with a substrate in position taken at the closeup identified as 16—16 in FIG. 14.

FIG. 17 is similar to FIG. 15 but shows a wafer which has been centered by the boss on the centering ring.

FIG. 18 is a partially sectioned perspective view showing the centering ring, its pin support, and its thermally insulating rings taken at 18—18 in FIG. 14.

FIG. 19 a partially sectioned perspective view of the centering ring (without the substrate present) showing the fastener for the thermally insulating rings taken at 19—19 of FIG. 14.

FIG. 20 is a partially sectioned exploded perspective view of FIG. 14 taken at 20—20 showing the grounding strap of the centering ring with the centering ring shown separated from the pedestal.

FIG. 21 shows a schematic diagram of an RF power supply to generate plasma in the processing chamber according to the invention.

DETAILED DESCRIPTION OF THE PREFERRED EMBODIMENTS

FIG. 8 shows a cross section of a processing chamber according to a first aspect of the invention. A pedestal 140 supports a wafer 142 on its upper surface 144. Gas entering the process gas inlet 44 is distributed in the lower manifold 54 and passes into the processing region chamber through the nozzles 42 in the showerhead 40. The process gas then flows as shown in FIG. 2 radially outwardly with respect to a central axis 141, across the edge of the wafer 142, across a peripheral centering ring 146, shown in FIG. 8, disposed in an annular ledge 148 recessed in the upper periphery of the pedestal 140. From thence, the process gas flows through a choke aperture 150 formed between the bottom of a modified annular isolator 152 and the top of a modified chamber wall insert 154 and into a modified pumping channel 160. The chamber wail insert 154 is shown to have a sealable passageway 156 through it and through the main chamber body 72 for an unillustrated robot blade to transfer wafers into and out of the reactor.

The gas, once it enters the pumping channel 160, is routed around the perimeter of the process chamber, similarly to the prior-art pumping channel 60 as shown in FIGS. 1 and 2, to be evacuated by the vacuum pumping system 82 connected to the process chamber.

The same general chamber is illustrated in FIG. 9 with different aspects of the invention being emphasized. The blown up cross section of FIG. 10 includes inventive aspects of both FIGS. 8 and 9.

The generally illustrated chamber insert 154 includes an L-shaped insulating ceramic ring 164 resting on the inside ledge 70 of the main chamber body 72 and also includes an annular or band shield 166 resting on an inside ledge 168 of the L-shaped ring 164 and spaced from the pedestal 140 and the centering ring 146 by a small gap. Ceramic chamber liners of themselves are well known, for example, as described by Robertson et al. in U.S. Pat. No. 5,366,585. The band shield 166 is preferably made of a metal, such as aluminum, and extends vertically upwardly substantially above the top of the L-shaped ceramic ring 164 and to a lesser extent above the supporting surface 144 of the pedestal 140.

The annular pumping channel 160 has sides generally defined by the band shield 166, the L-shaped ring 164, liners 170, 172 placed in front of the main chamber body 72 and the lid rim 66, and the isolator 152, with the choke aperture 150 being formed between the isolator 152 and the band shield 166. However, the lid liner 170 is placed on the side of the pumping channel 160 facing the lid rim 66 and conforms to its shape. The chamber liner 172 is placed on the side of the pumping channel 160 facing the main chamber body 72. Both liners 170, 172 are preferably made of a metal, such as aluminum, and are bead blasted to increase the adhesion of any film deposited thereon. The lid liner 170 is detachably fixed to the lid rim 66 by a number of pins 174 and is electrically grounded to the lid rim 66. However, the chamber liner 172 is supported on a ledge 176 formed on the outer top of the L-shaped ceramic ring 164 and is precisely formed to have a diameter such that a radial gap 178 is formed between the chamber liner 172 and the main chamber body 72, and an axial gap 180 is formed between the lid and chamber liners 170, 172. That is, the chamber liner 172 is electrically floating.

The band shield 166 and the lid and chamber liners 170, 172 are sized as a set. The band shield 166 is annular having a major diameter $d_1$ about the center of pedestal 140. The chamber liner 172 is also annular and in the shape of a band extending axially along the centerline of the pedestal 140 and with a major diameter $d_2$ greater than $d_1$. The lid liner 170 is also annular and has an L-shape with the long leg extending radially from $d_1$ to $d_2$ and a short leg extending axially at $d_2$.

A partially sectioned, perspective view is given in FIG. 11 of the pedestal 140, centering ring 146, and the liners 170, 172 and shields 152, 166 surrounding the pumping channel 160. This figure clearly shows the flow of processing gas out of the nozzles 42 of the showerhead 40 towards the wafer 142 and the subsequent radially outward flow 84 over the wafer 142 and then the centering ring 146. Thereafter, the gas flow is deflected upwardly over the top of the band shield 166 into the pumping channel 160, and in the pumping channel 160 it flows along a circumferential path 86 towards the vacuum pump.

The discussion of the pumping channel will be completed before the centering ring is again discussed.

As most clearly shown in FIG. 10, the pumping channel 160 and its components are designed to minimize the effect of any deposited conductive film upon the excitation of a plasma in and near the processing space 56.

Since the band shield 166 rises above the level of the wafer 142 and of most of the gas flowing over it, a dead space 184 is created in the flow pattern at the bottom of the pumping channel 160 adjacent to a top 186 of the L-shaped ring 164 where it meets the band shield 166. As a result, even though metal may deposit on the upper portion of the band shield 166, the dead space 184 ensures that a significant thickness of metal will not deposit around the backside of the band shield 166, and in particular an insufficient amount of metal will deposit to bridge a gap 188 formed between the band shield 166 and the top 186 of the L-shaped insulating ring 164. As a result, the band shield 166, even though conducting, remains electrically floating with respect to the pedestal 140 and the main chamber body 72. The band shield 166 has rounded ends 167 to reduce the possibility of arcing.

As is shown in FIG. 12, it is possible for the process gas to flow along a path 181 in the pumping channel 160 through the axial gap 180 at the top of the chamber liner 172 and then deposit a conductive film 182 in the axial gap 180 and in the radial gap 178 on the backside of the chamber liner 172. Since both gaps 178, 180 are dead space, it is unlikely that enough thickness would deposit to bridge either gap 178, 180, and, even if it would, any short across the gap would only ground the chamber liner 172. Another extraneous film in the pumping channel 160 would be required to bring the ground from the main chamber body 72 close enough to the processing space 56 to significantly affect the plasma fields. Very little, if any, gas will progress down to the bottom end of the radial gap 178 where deposition, if it occurs, might create a bridge between the chamber liner 172 and the main chamber body 72. However, because the chamber liner 172 is mounted on an outside ledge 176 of the insulating L-shaped ring 164, a conductive film would have to fill the gap between the L-shaped ring 164 and the main the chamber body 72 for the ground of the main chamber body 72 to extend to the band shield 166.

As shown in FIG. 13, an extraneous conductive film 120 deposited on the insulating ceramic isolator 152 on surfaces in and near the pumping channel 160 has the potential of extending the grounding plane of the lid rim 66 to the area adjacent to the biased showerhead 40 to significantly perturb the plasma electric fields and perhaps even to short the biased showerhead 40 across the isolator 152 to the chamber lid rim 66. However, as shown more clearly in FIG. 10, the L-shaped isolator 152 is formed on the outer side of the lower part of its depending inner skirt 203 with two deep annular grooves 205, 207 having widths sufficient to ensure that the deposited film 120 will not bridge the grooves 205, 207. Also, the grooves 205, 207 are deep enough that a dead space occurs at their bottom so that even though some deposition is inevitable, it does not form a continuous film on the interior surfaces of the grooves 205, 207. In addition, the openings of the grooves 205, 207 into the pumping channel 160 are generally rounded to prevent arcing from any built up conductive film. As exemplary dimensions, the grooves 205, 207 may have a width of 40 to 80 mils (1–2 mm) and a depth of 100 to 175 mils (2.5–4.6 mm) in the case that the isolator 152 has a width in the skirt 203 of 200 to 400 mils (5–10 mm). With this structure, even if the extraneous film 120, as illustrated in FIG. 13, does deposit on the isolator 152, it does not form a continuous conductive film. Thereby, neither is the showerhead 40 shorted out nor is an extraneous grounding plane established adjacent to the showerhead 40.

The lid liner 170, as illustrated in FIG. 10, is metallic and is both thermally and electrically connected to the lid rim 66, effectively forming an extension of it, and because of its remote location does not easily affect the plasma in the processing region 56. Any metal depositing on the lid liner 170 will not further affect the plasma as long as the metal does not extend over the isolator ring 152. In any case, the lid liner 170 is easily removed by means of the fastener 174 when it becomes excessively coated.

The discussion will now turn to the centering ring.

The centering ring 146 performs two functions. It acts to precisely center the wafer 142 on the pedestal 140, the wafer 142 having been transferred into the chamber and onto the pedestal 140 by a robot blade moving through the access passageway 156 of FIG. 8. This function blends with a retaining function in which the peripheral ring 146 acts as a retaining ring to hold the wafer 142 within its opening. Additionally, the centering ring 146 acts as a thermal blanket for the portion of the pedestal 140 exposed outside of the wafer 142. Specifically, its thermal characteristics are designed in view of the intended process so that the centering ring 146 thermally floats relative to the heated pedestal 140 and remains relatively cool compared to the wafer 142 and significantly cooler than the underlying pedestal 140, and thus little material is deposited on it during thermal CVD processing.

The centering function and the structure used to achieve it will be explained first.

The centering ring 146, as illustrated in plan view in FIG. 14 and in a sectioned perspective view in FIG. 15, includes a flat annular upper surface 190 and inside and below this surface 190 an annular ledge 192, which is sized so as to closely face the wafer 142 with a thin gap between it and the wafer 142 so as to provide thermal insulation but to nonetheless create a barrier to gas flow. The wafer 142 shown in FIG. 14 is substantially circular, as is the centering ring 146. However, if the wafer is formed with a large alignment flat on one edge, the inside of the centering ring 146 should be shaped to conform to the flat. As shown in FIG. 15, a step wall 194 rises from the ledge 192 to the flat upper surface 190 of the centering ring 146. The height of the step wall 194 equals or is somewhat more than the thickness of the wafer 142 so that the top surface of the wafer 142 supported on or cantilevered slightly above the surface of the ledge 192 is even with the upper surface 190 of the centering ring.

A series of six centering bosses 200, also shown in expanded plan view of FIG. 16, are equally distributed at 600 intervals about the centering ring 146 with respect to a center 201 of the pedestal 140 to which the centering ring 146 is also concentric. The centering bosses 200 rise from the ledge 192 but only partially protrude from the step wall 194. The bosses include a cylindrical base 202 and a truncated cone 204 above it, the separation line being somewhat below the planar upper surface 190 of the centering ring so that the truncated cone 204 projects above the planar upper surface 190. Even though the centering boss is defined in these simple geometric terms, both the convex and concave corners of the boss 200 are smoothed to reduce any arcing or chipping of the wafer. Related centering pins though mounted in the pedestal have been disclosed by Lei et al. in U.S. Pat. No. 5,516,367.

The centering ring 146 is supported on the pedestal 140 by mechanical means to be described later. When the robot blade transfers a wafer 142 into the chamber, both the pedestal 140 and the lift ring 39 of FIGS. 1 and 8 are lowered out of the way. The lift ring 39 then rises to raise the lift pins 38 out of the pedestal 140 to a sufficient height that their conical heads slightly lift the wafer 142 off the robot blade. The robot blade is then withdrawn, and the pedestal 140 and attached centering ring 146 are raised so that the lift pins 38 supporting the wafer 142 effectively retract toward the supporting surface 144 of the pedestal 140.

However, if the wafer 142 is not precisely centered with respect to the pedestal center 201, as it approaches the pedestal 140 it will first encounter one or two of the centering bosses 200 on their conical tops 204. The tapered surfaces of the conical tops 204 will exert sufficient lateral force on the wafer 142 that it will slide towards the center 201 of the pedestal 140, thus centering the wafer 142. The wafer 142, upon being further lowered relative to the pedestal 140 will be located, as illustrated in the partially sectioned perspective view of FIG. 17, in a centered position inside the cylindrical bases 202 of all the centering bosses 200.

The wafer 142 is thermally isolated from the centering ring 146 as much as possible. Because the cylindrical bases 202 of the bosses 200 only partially protrude into the area of the ledge 192, a gap 206, shown in FIG. 17, is formed between the beveled edge of the wafer 142 and the step wall 194 of the centering ring. Also, the locus of the extreme radially inward positions of the cylindrical bases 202 of the bosses 200 is sized to be slightly larger than the diameter of the wafer 142, such that a thin gap 208 is designed to exist between the wafer edge and the cylindrical bases 202. However, because of the centering action for a misaligned wafer, the wafer 142 may contact one or two of the centering bosses 200. Nonetheless, any resultant contact is a thin vertical line where the cylindrical wafer 142 contacts the cylindrical boss base 202 so as to minimize conductive heat transfer.

The wafer 142 during CVD processing is gravitationally supported on the pedestal 140, but the height of the upper surface of the ledge 194 of the centering ring 146 is tightly controlled so that it is slightly below the effective supporting surface 144 of the pedestal 140 and the wafer edge is cantilevered over the upper surface of the ledge 192 with a thin gap between. The gap between the wafer edge and the ledge 192 is large enough at the operational deposition pressures to provide good thermal isolation, but is small enough and long enough to present sufficient aerodynamic resistance to prevent flow of deposition gas to the backside of the wafer. Also, the gap is thin enough to prevent a plasma from entering the gap and producing arcing.

As a result of the following structure, the centering ring 146 is not only thermally isolated from the water 142 but is also thermally isolated from the pedestal 140.

Thermal isolation of the centering ring 146 from the pedestal 140 is achieved in two ways. The centering ring is preferably composed of aluminum or nickel-coated stainless steel. As best shown in the perspective view of FIG. 18, the centering ring 146 is supported above the peripheral ledge 148 of the pedestal 140 by three evenly spaced support pins 210 fixed into the ledge 148 of the pedestal 140 and projecting upwardly therefrom by a precise height. The support pins 210 effectively present point contacts between the pedestal 140 and the centering ring 146 because of their very small cross section compared to the area of the centering ring 146. The support pins 210 are preferably made of ceramic or a metal having a low thermal conductivity, such as stainless steel. Both the small size of the support pines 210 and their low thermal conductivity minimize the conduction of heat between the pedestal 140 and the centering ring 146. The support pins 210 loosely fit into respective radial slots 212 extending from a bottom of an outer annular base 214 of the centering ring 146 and support the centering ring 146 at a precisely set height above the pedestal's ledge 148. The radially elongated shape of the slots 212 allows for differential thermal expansion between the centering ring 146 and the pedestal 140.

Radiative and convective thermal transfer between the bottom of the centering ring 142 and the pedestal is minimized by a stack of thermally insulating rings 216, 218 spaced between a bottom surface of an inwardly projecting rim 220 of the centering ring 146 and the ledge 148 of the pedestal 140. The thermally insulating rings 216, 218 are preferably formed of ceramic or other material of low thermal conductivity, such as stainless steel, to reduce the conductive transfer of heat therethrough.

As illustrated in the cutaway perspective view of FIG. 19, the thermally insulating rings 216, 218 are fixed to the bottom of the projecting rim 220 of the centering ring 146 by a series of fasteners 224, such as screws or rivets, arranged on the centering ring 146, as shown in the plan view of FIG. 14. The fasteners 224 are positioned so that gaps are formed between the pair of rings 216, 218 and both the base 214 of the centering ring 146 and the ledge 148 of the pedestal 140. Conical heads 225 of the screw fasteners 224 are recessed in counter sinks 226 at the bottom of the bottom ring 218 so as to present a smooth surface. The two rings 216, 218 are separated from each other and from the projecting rim 220 of the centering ring 146 by either thermally insulating spacers 227 or by spacing bumps 228, shown in FIG. 20, to form a gap 229 between the rings 216, 218 as well as a gap 229A between the rings and the projection 220 of the centering ring 146. These various gaps further cause the rings 216, 218 to thermally float so as to more effectively thermally separate the centering ring 146 from the pedestal 140. Two such rings have been shown to reduce the radiative thermal transfer by 65%; three rings, by 75%.

These different thermal isolation means have been tested in a prototype reactor during normal CVD processing of the type described before. In these tests, the temperature of the pedestal 140 was measured to be 430° C., the temperature of the wafer 142 to be 360° C., but the temperature of the centering ring 146 to be only 290° C. At 360° C., satisfactory thermal deposition of TiN is achieved on the wafer 142, but at 290° C. little or none of the same material deposits on the centering ring 146. These temperature differentials are driven by a showerhead 40 that remains at about 100° C. as well as by other thermal leakages to the side.

The many means used to thermally isolate the centering ring 146 also tend to electrically isolate it. As a result, it tends to become electrically charged in the presence of a plasma in the processing space 56. Such electrical charging needs to be avoided because it can produce arcing between the centering ring 146 and the wafer 142, causing direct damage to the wafer. Arcing to any other point produces particles which are apt to settle on the wafer and produce defects. Thus, it is desired that the centering ring 146 and the pedestal 142 be held to the same electrical potential.

One structure to fix the potential of the centering ring 146 to that of pedestal 140 is a thin, solid, flexible grounding strap 230 illustrated in the cutaway perspective view of FIG. 20. The grounding strap 230 is composed of a thin tab 232 of an electrically conductive and mechanically soft metal, such as aluminum, which is permanently joined to the base 214 of the centering ring 146 by a weld 234. The thickness of the metal tab 232 is thin enough so that it conducts little heat and does not mechanically support the centering ring 146.

The pedestal 140 is formed on its periphery with a shallow, axially extending slot 236 with a deeper slot section 238 being formed at its bottom. The tab 232 is bent at its bottom into a Z-shaped section 240 such that the upper part of the tab 232 fits into the shallow slot 236 and the Z-shaped section 240 fits into the deeper slot section 238. A hole 242 formed in the very bottom of the tab 232 passes a screw 244, which is then threaded into a corresponding hole in the pedestal 140 within the deeper slot section 238, thus completing the electrical grounding. The shallow slot 236 encompasses both the tab 232 and the head of the screw 244 so as to maintain a nominal perimeter outline 246 of the pedestal 140. Also, the shallow slot 236 and the ground strap 230 are configured such that any differential motion due to temperature differences between the pedestal 140 and the centering ring 146 are accommodated without interference between the pieces while electrical continuity is maintained between the centering ring 146 and the pedestal 140.

FIG. 21 shows a configuration according to the present invention of the RF power supply to be compared to that of FIG. 7. Here, there is no power splitting during the plasma treatment used in conjunction with the thermal TDMAT deposition of TiN. Instead, the pedestal electrode 132 is maintained at a ground potential, and only the upper electrode 134 is powered by an RF generator 250 with a fixed matching circuit 252. The liners used in the pumping channel and the grounded centering ring of the invention sufficiently stabilize the plasma 254 that the power splitting between the electrodes 132, 134 as required before is no longer necessary. It is preferred that no bias be applied to the pedestal 132 supporting the electrode since any RF bias tends to electrically charge the wafer and to induce it to discharge to adjacent points, thus causing direct damage or particles.

The pumping chamber liners and the centering ring of the invention can be easily replaced with new or refurbished components whenever films, particularly conductive films, inevitably build up on them. However, testing in a realistic operating environment has shown that even after 3000 wafers, the novel design has minimized the deposition to the point that they do not need to be replaced. Thus, some relatively simple improvements to the equipment peripheral to the pedestal, all within the confines of the existing chamber of FIG. 1, substantially reduce downtime of the CVD system while providing superior plasma conditions.

Although the invention been described with respect to a thermal CVD of TiN followed by a plasma treatment, the invention is obviously applicable to any process in which the same chamber is used for a thermal metal deposition and another plasma process. For example, the titanium layer 106 can be deposited by a plasma process using $TiCl_4$ as the precursor and using the thermal TDMAT process for the TiN layer. Also, the process can be advantageously applied to CVD of conductive metal oxides, such as perovskites including lanthanum oxide. The combination of deposition of conductive metals and a plasma step would still present the potential problems of a thermal process depositing extraneous metal layers which could affect the plasma process. The invention is of course applicable to many other types of metal CVD processes and should be useful in dielectric CVD and other plasma applications as well.

While the invention has been described to specific embodiments, those skilled in the art will recognize that changes can be made in form and detail without departing from the sphere and scope of the invention.

What is claimed is:

1. A plasma reactor, comprising:
    a main processing chamber including a pedestal for supporting a substrate thereon;
    an inlet for admitting processing gas into said chamber;
    a pumping channel surrounding a periphery of said main processing chamber, vacuum sealed thereto, connected thereto by a passageway, and connectable to a vacuum pumping system; and
    at least one removable liner placed on walls inside of said pumping channel.

2. The plasma reactor of claim 1, wherein said passageway is formed between a main chamber body of said reactor and a lid of said reactor so that said passageway is substantially continuous.

3. The plasma reactor of claim 2, wherein said passageway presents a choke point for said processing gas flowing from said main processing chamber into said pumping channel.

4. The plasma reactor of claim 2, wherein said lid includes a biasable electrode opposed to said pedestal and further comprising an isolator member surrounding said biasable electrode for electrically insulating it from said main chamber body, said isolator member forming a portion of a wall of said pumping channel and including grooves formed therein and facing said pumping channel.

5. The plasma reactor of claim 1, wherein at least one of said at least one removable liner is electrically floating.

6. The plasma reactor of claim 1, wherein said at least one removable liner comprises a metallic liner.

7. The plasma reactor of claim 1, wherein said at least one removable liner comprises three metallic liners configured to be disposed on different wall portions of said pumping channel.

8. The plasma reactor of claim 7, wherein said three liners comprise:
    a first annular liner shaped in a band and having a first major diameter;

a second annular liner shaped in a band and having a second major diameter greater than said first major diameter; and a third annular liner having a radially extending portion extending between said first major diameter and said second major diameter and an axially extending portion connected thereto and having said second major diameter.

9. The plasma reactor of claim 1, wherein said at least one removable liner comprises three removable liners configured to be disposed on different wall portions of said pumping channel.

10. The plasma reactor of claim 1, wherein said processing chamber and said inlet are configured for chemical vapor deposition.

11. An isolator ring usable in a plasma reaction chamber comprising an electrically insulating ceramic material and having a generally cylindrical shape about an axis with a first rim portion extending radially outwardly and a second skirt portion extending axially downwardly with circumferential grooves formed on a radially outwardly facing surface at a bottom of said skirt portion.

12. The isolator ring of claim 11, wherein said grooves have rounded corners at said outwardly facing surface.

13. The isolator ring of claim 12, wherein said skirt portion has a radial thickness in a range of 5 to 10 mm, and said grooves have widths in a range of 1 to 2 mm and depths in a range of 2.5 to 4.6 mm.

14. A set of channel liners comprising metals and including:

a first annular liner shaped in a band and having a first major diameter;

a second annular liner shaped in a band and having a second major diameter greater than said first major diameter; and a third annular liner having a radially extending portion extending between said first major diameter and said second major diameter and an axially extending portion connected thereto and having said second major diameter.

15. The set of claim 14, wherein said first annular liner has rounded axial ends.

16. A plasma reactor, comprising:

a main processing chamber including a pedestal for supporting thereon a substrate to be processed;

an inlet for admitting processing gas into said chamber;

a pumping channel surrounding a periphery of said chamber, connected thereto by a restricted passageway, and connectable to vacuum pumping system; and a ceramic first liner and a ceramic second liner forming walls of said pumping channel and defining therebetween said passageway, wherein said first liner includes at least one annular groove facing said pumping channel.

17. The plasma reactor of claim 16, wherein said first and second liners are removable from said channel.

18. The plasma reactor of claim 17, further comprising a removable metal third liner forming another wall of said pumping channel.

19. The plasma reactor of claim 16, wherein said chamber includes an electrically biasable lid portion and wherein said first liner electrically isolates walls of said chamber form said lid portion.

20. The plasma reactor of claim 16, wherein said processing chamber and said inlet are configured for chemical vapor deposition.

* * * * *